United States Patent
Lee et al.

(10) Patent No.: US 12,159,893 B2
(45) Date of Patent: Dec. 3, 2024

(54) IMAGE SENSOR INCLUDING COLOR SEPARATING LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Sangyun Lee, Yongin-si (KR); Sookyoung Roh, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 607 days.

(21) Appl. No.: 17/514,663

(22) Filed: Oct. 29, 2021

(65) Prior Publication Data

US 2022/0139994 A1 May 5, 2022

(30) Foreign Application Priority Data

Oct. 30, 2020 (KR) .................. 10-2020-0143872
Jun. 25, 2021 (KR) .................. 10-2021-0083126

(51) Int. Cl.
  *H01L 27/146* (2006.01)

(52) U.S. Cl.
  CPC .. *H01L 27/14645* (2013.01); *H01L 27/14621* (2013.01); *H01L 27/14623* (2013.01); *H01L 27/14627* (2013.01)

(58) Field of Classification Search
  None
  See application file for complete search history.

(56) References Cited

U.S. PATENT DOCUMENTS

| 8,289,422 | B2 | 10/2012 | Hiramoto et al. |
| 9,323,066 | B2 * | 4/2016 | Bae ............ H04N 13/356 |
| 9,748,305 | B2 | 8/2017 | Shin |
| 10,546,897 | B2 | 1/2020 | Yun et al. |

(Continued)

FOREIGN PATENT DOCUMENTS

| CN | 101309359 B | 2/2013 |
| CN | 106483594 A | 3/2017 |

(Continued)

OTHER PUBLICATIONS

Office Action issued on Dec. 4, 2023 by the Korean Patent Office in corresponding KR Patent Application No. 10-2021-0083126.

(Continued)

*Primary Examiner* — Bilkis Jahan
(74) *Attorney, Agent, or Firm* — Sughrue Mion, PLLC

(57) ABSTRACT

An image sensor includes: a sensor substrate including a first pixel and a second pixel; and a color separating lens array for condensing light of first wavelength onto the first pixel by changing a phase of light of the first wavelength included in incident light, wherein the sensor substrate further includes: an active pixel area for outputting an active pixel signal for image generation; a first dummy pixel area arranged outside the active pixel area and outputting a dummy pixel signal to correct image data generated from the active pixel signal; and a second dummy pixel area arranged outside the active pixel area and the first dummy pixel area and not outputting any pixel signal.

30 Claims, 41 Drawing Sheets

(56) References Cited

U.S. PATENT DOCUMENTS

| | | | |
|---|---|---|---|
| 2006/0209413 A1* | 9/2006 | Kim | G01J 3/26 |
| | | | 359/577 |
| 2012/0099008 A1 | 4/2012 | Horikawa et al. | |
| 2012/0206637 A1 | 8/2012 | Hiramoto et al. | |
| 2012/0212656 A1 | 8/2012 | Hiramoto et al. | |
| 2014/0284455 A1* | 9/2014 | Hiramoto | H01L 27/14625 |
| | | | 257/432 |
| 2015/0286060 A1 | 10/2015 | Roh et al. | |
| 2016/0109716 A1 | 4/2016 | Sohn | |
| 2017/0092676 A1* | 3/2017 | Yun | H01L 27/14609 |
| 2018/0006071 A1* | 1/2018 | Kato | H01L 27/14625 |
| 2018/0323242 A1* | 11/2018 | Drzaic | H10K 59/122 |
| 2021/0124179 A1 | 4/2021 | Yun et al. | |
| 2021/0126030 A1 | 4/2021 | Yun et al. | |
| 2021/0288095 A1 | 9/2021 | Delga et al. | |
| 2021/0384243 A1* | 12/2021 | Nagatomo | H01L 27/14612 |

FOREIGN PATENT DOCUMENTS

| | | |
|---|---|---|
| JP | 2018-11040 A | 1/2018 |
| KR | 10-0962005 B1 | 6/2010 |
| KR | 10-2010-0077988 A | 7/2010 |
| KR | 10-2015-0116347 A | 10/2015 |
| KR | 10-2016-0025895 A | 3/2016 |
| KR | 10-2016-0046370 A | 4/2016 |
| KR | 10-1772968 B1 | 8/2017 |
| KR | 10-2018-0044761 A | 5/2018 |
| KR | 10-2018-0131175 A | 12/2018 |
| KR | 10-2021-0048400 A | 5/2021 |
| WO | 2020/007622 A1 | 1/2020 |

OTHER PUBLICATIONS

Communication dated Mar. 21, 2022 issued by the European Patent Office in European Application No. 21205331.8.

Seiji Nishiwaki et al., "Efficient colour splitters for high-pixel-density image sensors", Nature Photonics, vol. 7, 2013, 7 pages total.

* cited by examiner

| | 1110 | | 1120 | | 1130 | | 1140 | |
|---|---|---|---|---|---|---|---|---|
| | 111 (0.000) | 112 (0.000) | 111 (0.000) | 112 (0.001) | 111 (0.002) | 112 (0.000) | 111 (0.000) | 112 (0.000) |
| | 113 (0.000) | 114 (0.000) | 113 (0.001) | 114 (0.004) | 113 (0.008) | 114 (0.002) | 113 (0.000) | 114 (0.000) |
| | 111 (0.000) | 112 (0.001) | 111 (0.004) | 112 (0.014) | 111 (0.060) | 112 (0.009) | 111 (0.002) | 112 (0.000) |
| | 113 (0.000) | 114 (0.002) | 113 (0.007) | 114 (0.059) | 113 (0.004) | 114 (0.056) | 113 (0.008) | 114 (0.002) |
| | 111 (0.000) | 112 (0.000) | 111 (0.002) | 112 (0.009) | 111 (0.060) | 112 (0.014) | 111 (0.004) | 112 (0.001) |
| | 113 (0.000) | 114 (0.000) | 113 (0.000) | 114 (0.002) | 113 (0.007) | 114 (0.004) | 113 (0.001) | 114 (0.000) |

# IMAGE SENSOR INCLUDING COLOR SEPARATING LENS ARRAY AND ELECTRONIC APPARATUS INCLUDING THE IMAGE SENSOR

CROSS-REFERENCE TO RELATED APPLICATIONS

This application is based on and claims priority under 35 U.S.C. § 119 to Korean Patent Application No. 10-2020-0143872, filed on Oct. 30, 2020, and Korean Patent Application No. 10-2021-0083126, filed on Jun. 25, 2021, in the Korean Intellectual Property Office, the disclosures of which are incorporated by reference herein in their entireties.

BACKGROUND

1. Field

Apparatuses and methods consistent with example embodiments relate to an image sensor including a color separating lens array capable of separately focusing incident light according to the wavelength of the incident light, and an electronic apparatus including the image sensor.

2. Description of the Related Art

Image sensors generally sense the color of incident light by using a color filter. However, a color filter may have low light utilization efficiency because the color filter absorbs light of colors other than the corresponding color of light. For example, when an RGB color filter is used, only ⅓ of the incident light is transmitted and the other part of the incident light, that is, ⅔ of the incident light, is absorbed. Thus, the light utilization efficiency is only about 33%. Thus, in a color display apparatus or a color image sensor, most light loss occurs in the color filter.

SUMMARY

One or more example embodiments provide an image sensor having improved light utilization efficiency by using a color separating lens array capable of focusing incident light separately according to wavelengths of the incident light, and an electronic apparatus including the image sensor.

Additional aspects will be set forth in part in the description which follows and, in part, will be apparent from the description, or may be learned by practice of the presented embodiments of the disclosure.

According to an example embodiment, an image sensor may include: a sensor substrate including: an active pixel area configured to output an active pixel signal for image generation; a first dummy pixel area disposed outside the active pixel area and outputting a dummy pixel signal to correct image data generated from the active pixel signal; and a second dummy pixel area disposed outside the active pixel area and the first dummy pixel area and configured to not output any pixel signal; and a color separating lens array facing the sensor substrate, wherein the color separating lens array may be configured to condense at least portion of a first light of a first wavelength incident on a region of the color separating lens array facing the second dummy pixel area of the sensor substrate, onto a first pixel in the first dummy pixel area of the sensor substrate, by changing a phase of the first light of the first wavelength.

The second dummy pixel area may include pixels arranged in two or more columns or two or more rows outside the active pixel area.

The color separating lens array may include nanoposts above the active pixel area, the first dummy pixel area, and the second dummy pixel area.

The color separating lens array may change a phase of a second light of a second wavelength to be different from the phase of the first light of the first wavelength and condense the second light of the second wavelength onto a second pixel of the sensor substrate.

The dummy pixel signal output from the first dummy pixel area may be a signal for correcting the active pixel signal output from the active pixel area.

The first dummy pixel area may be disposed on an outer side of the active pixel area to surround the active pixel area.

The second dummy pixel area may be disposed on an outer side of the first dummy pixel area to surround the first dummy pixel area.

The sensor substrate may further include an optical black area that is disposed on an outer side of the second dummy pixel area and comprises a light-shielding metal layer, the optical black area being configured to output a black pixel signal.

The color separating lens array may include nanoposts disposed above the optical black area.

The optical black area may be disposed on the outer side of the second dummy pixel area to surround the second dummy pixel area.

The optical black area of the sensor substrate may output pixel signals based on noise of a photodiode.

The color separating lens array may include a plurality of microlenses configured to condense the first light of the first wavelength on the first pixel, and an area of each of the plurality of microlenses is greater than an area of the first pixel.

The area of each of the plurality of microlenses may be 1.5 to 4 times greater than the area of the first pixel.

According to an aspect of another example embodiment, an electronic apparatus may include: the image sensor; and a processor configured to control operations of the image sensor and to store and output a signal generated by the image sensor.

The processor may be further configured to obtain an image based on the active pixel signal and the dummy pixel signal.

The processor may be further configured to: determine whether an active pixel in the active pixel area is abnormal based on comparison between a pixel value of the active pixel and pixel values of adjacent pixels that are immediately adjacent to the active pixel, wherein the adjacent pixels comprise at least one dummy pixel included in the first dummy pixel area; and adjust the pixel value of the active pixel based the pixel values of the adjacent pixels, based on the active pixel being determined to be abnormal, and obtain the image based on the adjusted pixel value of the active pixel.

According to an aspect of another example embodiment, an image sensor may include: a sensor substrate including: an active pixel area configured to output an active pixel signal for image generation; a dummy pixel area disposed outside the active pixel area and outputting a dummy pixel signal to correct image data generated from the active pixel signal; and an optical black area disposed outside the active pixel area and the dummy pixel area and configured to output a black pixel signal; and a color separating lens array facing the sensor substrate, wherein the color separating lens array is configured to condense at least portion of a first light of a first wavelength incident on a region of the color separating lens array facing the optical black area, onto a first pixel in the dummy pixel area.

The optical black area may include pixels arranged in two or more columns or two or more rows outside the active pixel area.

The color separating lens array may include nanoposts above the active pixel area, the dummy pixel area, and the optical black area.

The color separating lens array may change a phase of a second light of a second wavelength to be different from a phase of the first light of the first wavelength and condenses the second light of the second wavelength onto a second pixel of the sensor substrate.

The sensor substrate may include a light-shielding metal layer formed on pixels included in the optical black area of the sensor substrate.

The dummy pixel signal output from the dummy pixel area may be a signal for correcting the active pixel signal output from the active pixel area.

The dummy pixel area may be disposed on an outer side of the active pixel area to surround the active pixel area.

The optical black area may be disposed on an outer side of the dummy pixel area to surround the dummy pixel area.

Each of pixels included in the optical black area output the black pixel signal based on noise of a photodiode.

The color separating lens array may include a plurality of microlenses configured to condense the first light of the first wavelength on the first pixel, and an area of the plurality of microlenses is greater than an area of the first pixel.

The area of the plurality of microlenses may be 1.5 to 4 times greater than the area of the first pixel.

According to an aspect of another example embodiment, an electronic apparatus may include: the image sensor; and a processor configured to control operations of the image sensor and to store and output a signal generated by the image sensor.

The processor may be further configured to obtain an image based on the active pixel signal and the dummy pixel signal.

The processor may be further configured to: determine whether an active pixel in the active pixel area is abnormal based on comparison between a pixel value of the active pixel and pixel values of adjacent pixels that are immediately adjacent to the active pixel, wherein the adjacent pixels comprise at least one dummy pixel included in the dummy pixel area; adjust the pixel value of the active pixel based the pixel values of the adjacent pixels, based on the active pixel being determined to be abnormal, and obtain the image based on the adjusted pixel value of the active pixel.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
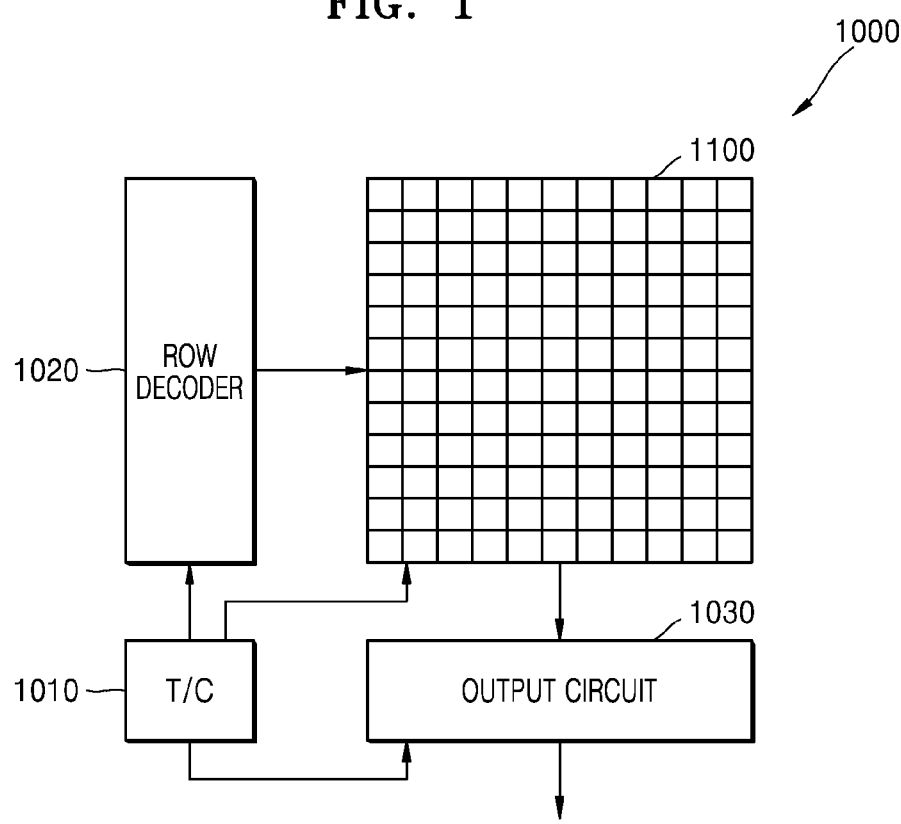
FIG. 1 is a block diagram of an image sensor according to an example embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array and an electronic apparatus including the image sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing a function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a block diagram of an image sensor 1000 according to an example embodiment. Referring to FIG. 1, the image sensor 1000 may include a pixel array 1100, a timing controller 1010, a row decoder 1020, and an output circuit 1030. An image sensor 1000 may include a charge coupled device (CCD) image sensor or a complementary metal oxide semiconductor (CMOS) image sensor that converts an optical image into an electrical signal.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs disposed respectively for the columns in the pixel array 1100 or one ADC disposed at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

Figure 2A:
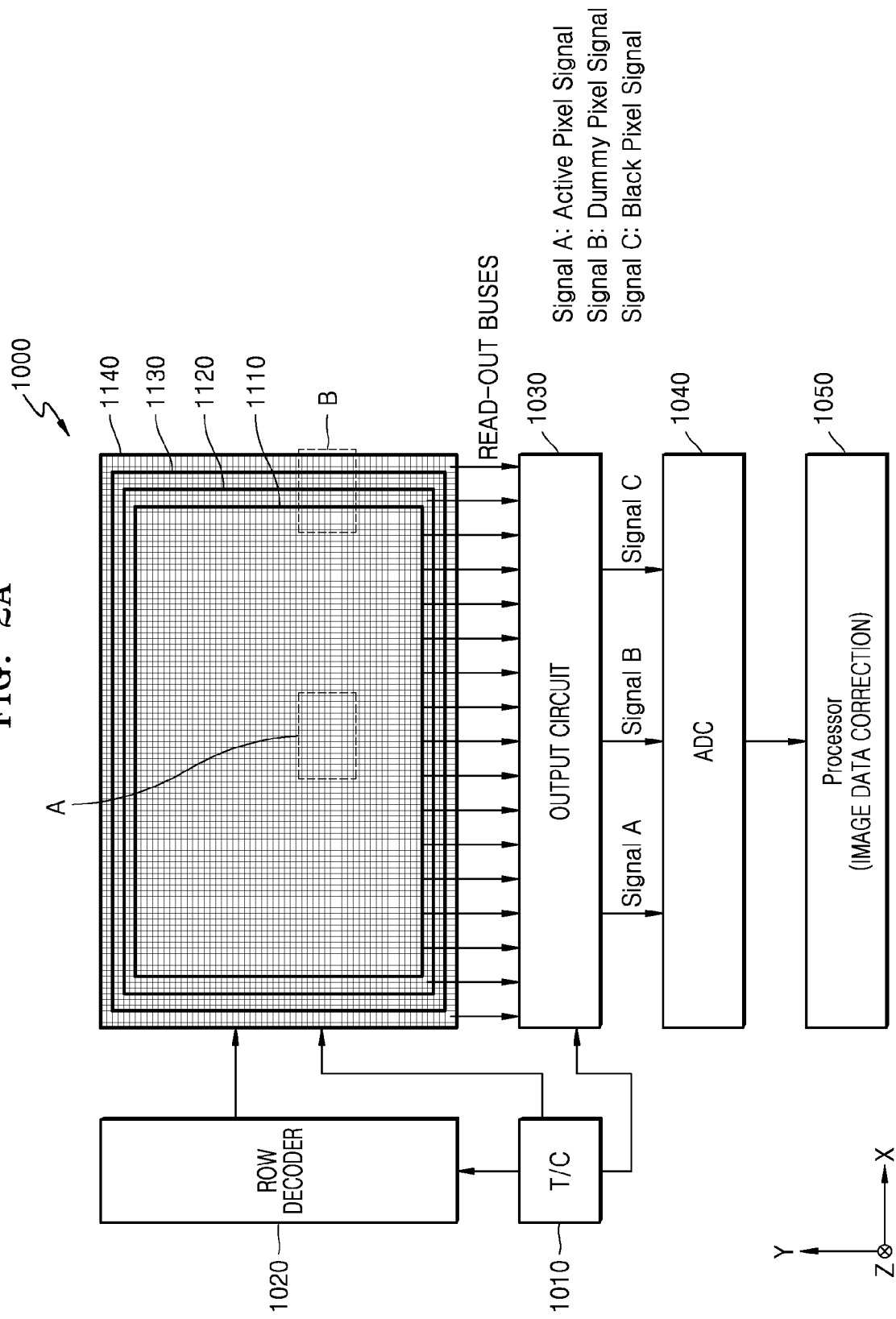
FIGS. 2A and 2B are diagrams showing a pixel array of FIG. 1, based on functions of pixels included in the pixel array.
Figure 2B:
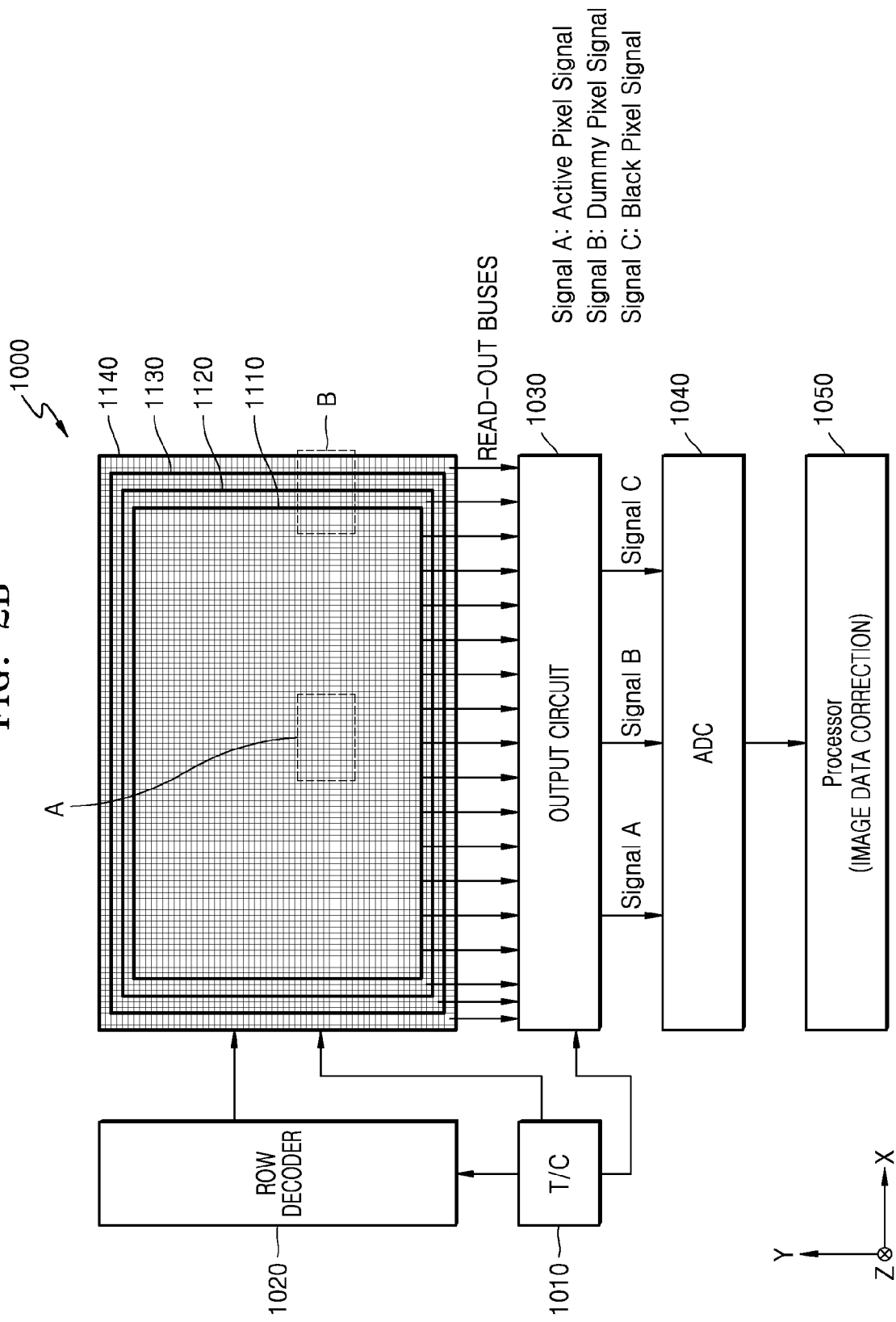

FIGS. 2A and 2B are diagrams showing a pixel array of FIG. 1 based on functions performed by pixels included in the pixel array.

Referring to FIG. 2A, the pixel array 1100 may include an active pixel area 1110 outputting a pixel signal for generating an image, a first dummy pixel area 1120 disposed outside the active pixel area 1110 and outputting a pixel signal for aiding image generation, a second dummy pixel area 1130 disposed outside the first dummy pixel area 1120 and not outputting a pixel signal, and an optical black area 1140 disposed outside the second dummy pixel area 1130 and including a light-shielding metal layer for outputting a background signal.

The pixel array 1100, the active pixel area 1110, the first dummy pixel area 1120, and the optical black area 1140 may be connected to the output circuit 1030, via read-out buses. In an example embodiment, a read-out bus may not be provided between the second dummy pixel area 1130 and the output circuit 1030 so that a pixel signal is not transmitted from the second dummy pixel area 1130 to the output circuit 1030.

The active pixel area 1110 is an area including active pixels outputting signals that are directly used to generate an image provided by the image sensor 1000 are disposed. Some or all of the pixels included in the active pixel area 1110 may sense, from light incident on the image sensor, light of a certain wavelength band, that is, light of a certain color, and may output an intensity of a color component included in incident light. The active pixel area 1110 may include three or more kinds of pixels, for example, may include a green pixel for sensing an intensity of a green light component in the incident light, a red pixel for sensing an intensity of a red light component, and a blue pixel for sensing an intensity of a blue light component in the incident light. In detail, the green pixel may mainly receive light of a green wavelength band (500 nm to 565 nm) included in the incident light, and may output the intensity of the green light component as a pixel signal, e.g., a voltage, by photoelectrically converting the light. Each pixel may include one or more sub-pixels that are units for independently performing photoelectric conversion, for example, one green pixel may include two or four sub-pixels.

The output circuit 1030 may output an active pixel signal, a dummy pixel signal, and a black pixel signal corresponding to pixel values that are read from the active pixel area 1110, the first dummy pixel area 1120, and the optical black area 1140, respectively.

The image sensor 1000 may further include an analog-to-digital signal converter (ADC) 1040 and a processor 1050. The ADC 1040 may convert the active pixel signal, the dummy pixel signal, and the black pixel signal in analog form into the active pixel signal, the dummy pixel signal, and the black pixel signal in digital form, respectively. The processor 1050 may process the active pixel signal, the dummy pixel signal, and the black pixel signal in digital form, to obtain image data. For example, the processor 1050 may correct the image data obtained from the active pixel signal, based on the dummy pixel signal, and the black pixel signal.

The image sensor 1000 may generate an image by using an active pixel signal output from each of the active pixels disposed in the active pixel area 1110, and as the number of active pixels in the active pixel area 1110 increases, an image of a high resolution may be generated. In other words, each active pixel in the active pixel area 1110 may correspond to a minimum unit of image representation, and thus, as the number of active pixels in the active pixel area 1110 increases, an image that is finely represented may be generated. The active pixels may be exposed to an incident radiation, to capture an image projected onto a surface of the image sensor 1000, and may generate electric signals in response to optical characteristics (e.g., a light intensity, a wavelength, and the like) of a light incident onto the active pixel area 1110. Like the active pixel signals, pixel signals contributing to increase in the resolution of the generated image may be understood as being directly used in the image generation.

The first dummy pixel area 1120 is an area including dummy pixels that output signals that are indirectly used in image generation. The signals output from the first dummy pixel area 1120 may be image correction signals that are employed in conjunction with data correction for the active pixels. The first dummy pixel area 1120 may surround the active pixel area 1110 along an outer periphery of the active pixel area 1110. A structure of each dummy pixel in the first dummy pixel area 1120 may be the same as that of each active pixel included in the active pixel area 1110, but dummy pixel signals output from the first dummy pixel area 1120 are different from active pixel signals output from the active pixel area 1110 in that the dummy pixel signals do not contribute to increase in the resolution of the image.

The dummy pixel signals output from the pixels in the first dummy pixel area 1120 may be used to improve the image quality. For example, when some active pixels in the active pixel area 1110 abnormally operate, a replacement signal that may be used instead of the active pixel signal from the abnormal active pixel is generated by interpolating signals of peripheral pixels around the abnormal active pixel. The peripheral pixels around the abnormal pixels may include only active pixels, or may include one or more dummy pixels, depending on the location of the abnormal active pixel. When the abnormal active pixel is disposed at an outermost part of the active pixel area 1110, e.g., a boundary between the active pixel area 1110 and the first dummy pixel area 1120, the pixel signal of the abnormal active pixel may be obtained by using signals from the dummy pixels in the first dummy pixel area 1120, which are adjacent to the abnormal active pixel. The dummy pixel signal of the first dummy pixel area 1120 may not contribute to the increase in the resolution of the image, but contributes to the increase in the generated image quality, and thus, it may be considered that the pixel signal is indirectly used in the image generation.

In an example embodiment of the present disclosure, the processor 1050 may compare a pixel value of each of a plurality of pixels, with pixel values of adjacent pixels, and when a difference between a pixel value of a specific pixel and pixel values of its adjacent pixels is greater than a preset difference, the processor 1050 may determine the specific pixel as an abnormal active pixel. For example, when the specific pixel is surrounded by eight adjacent pixels, the processor 1050 may compare the pixel value of the specific pixel with an average of the pixel values of the eight adjacent pixels. The processor 1050 may determine the specific pixel as an abnormal pixel when a difference between the pixel value of the specific pixel and the average of the pixel values of the eight adjacent pixels is greater than the preset difference. When the specific pixel is determined as an abnormal pixel, the processor 1050 may perform interpolation on the pixel values of the eight adjacent pixels, to obtain an interpolation pixel value, and may replace the pixel value of the specific pixel with the interpolation pixel value.

The dummy pixel signal of the first dummy pixel area 1120 may be used in a focusing operation, and an optical image stabilization (OIS) as well as the correction of the pixel signal from the active pixel area 1110.

The second dummy pixel area 1130 is an area including pixels that do not output signals, and may be disposed to surround the first dummy pixel area 1120 along an outer periphery of the first dummy pixel area 1120. The dummy pixels in the second dummy pixel area 1130 do not output pixel signals, and thus are different from those of the first dummy pixel area 1120. The second dummy pixel area 1130 provides a space through which portion of the light proceeding toward the second dummy pixel area 1130 may proceed to the first dummy pixel area 1120, and thus, the pixels in the first dummy pixel area 1120 may sense the light in the same condition as those of the pixels in the active pixel area 1110. A structure of the second dummy pixel area 1130 will be described later with reference to FIG. 10A.

The optical black area 1140 is an area including optical black pixels that output pixel signals under no incident light, that is, black level or dark level signals (which is also referred to as a black pixel signal). The optical black pixels may be substantially unaffected by light incident upon the image sensor 1000. The optical black area 1140 may be shielded from radiation that is incident upon the surface of the image sensor 1000. The optical black area 1140 may be disposed to surround the second dummy pixel area 1130 on the outer side of the second dummy pixel area 1130. The optical black area 1140 is different from the active pixel area 1110 and the first and second dummy pixel areas 1120 and 1130, in view of including a light-shielding layer for shielding the light incident on the pixels. The light-shielding layer may include a light-absorbing medium. The optical black pixels in the optical black area 1140 may output black level or dark level signals, e.g., noise generated due to a material or a structure of a photodiode included in the pixel, or noise generated from other elements, than the photodiode, in the pixel. The black level or dark level signal may be used as a reference signal for correcting noise of the active pixel signal from the active pixel area 1110 and the dummy pixel signal from the first dummy pixel area 1120. Thus, the optical black area 1140 may provide a based line electric signal level of the active pixels and the first dummy pixels. The structure of the optical black area 1140 will be described later with reference to FIG. 10A.

In another example embodiment shown in FIG. 2B, readout buses may be provided between each of the active pixel area 1110, the first dummy pixel area 1120, the second dummy pixel area 1130, and the optical black area 1140, and the output circuit 1030.

The output circuit 1030 may obtain pixel values that are read from each of the active pixel area 1110, the first dummy pixel area 1120, the second dummy pixel area 1130, and the optical black area 1140, via read-out buses connected therebetween. The output circuit 1030 may disregard the pixel values that are read from the second dummy pixel area 1130, and may output an active pixel signal, an dummy pixel signal, and a black pixel signal based on the pixel values that are read from the active pixel area 1110, the first dummy pixel area 1120, and the optical black area 1140, respectively.

Other than the connection between the second dummy pixel area 1130 and the output circuit 1030, and the manner in which the output circuit 1030 operates in connection with the pixel value read from the second dummy pixel area 1130, the elements shown in FIG. 2B operate in substantially the same way as those in FIG. 2A. Therefore, redundant descriptions are omitted.

Figure 3A:
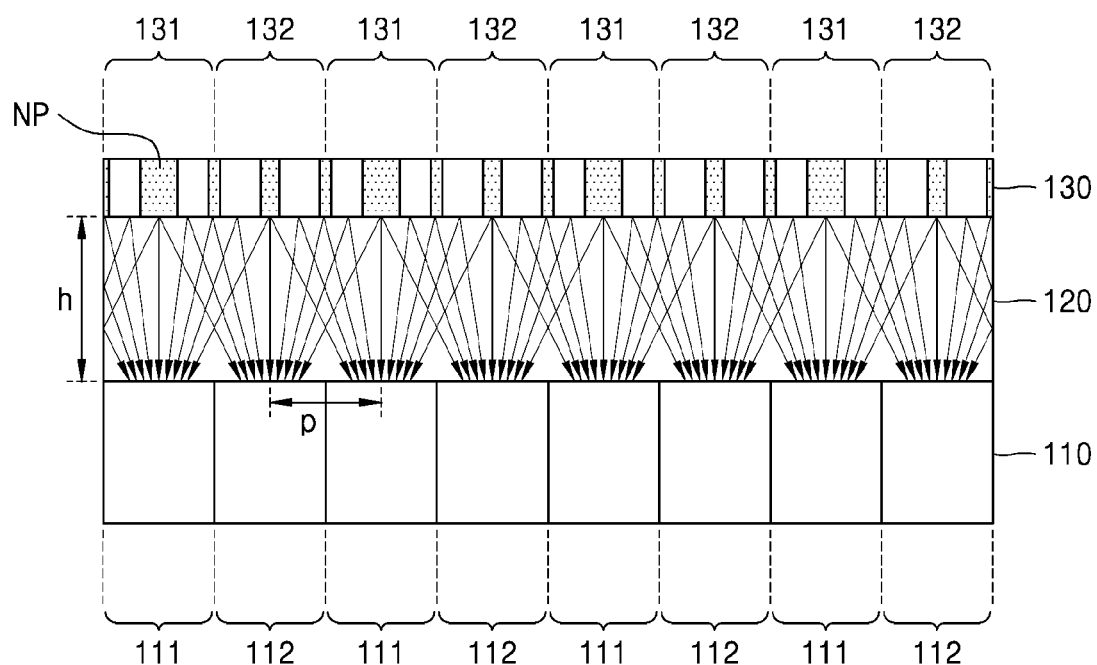
FIGS. 3A and 3B are cross-sectional views seen from different directions of a region A in an active pixel area of FIGS. 2A and 2B.
Figure 3B:
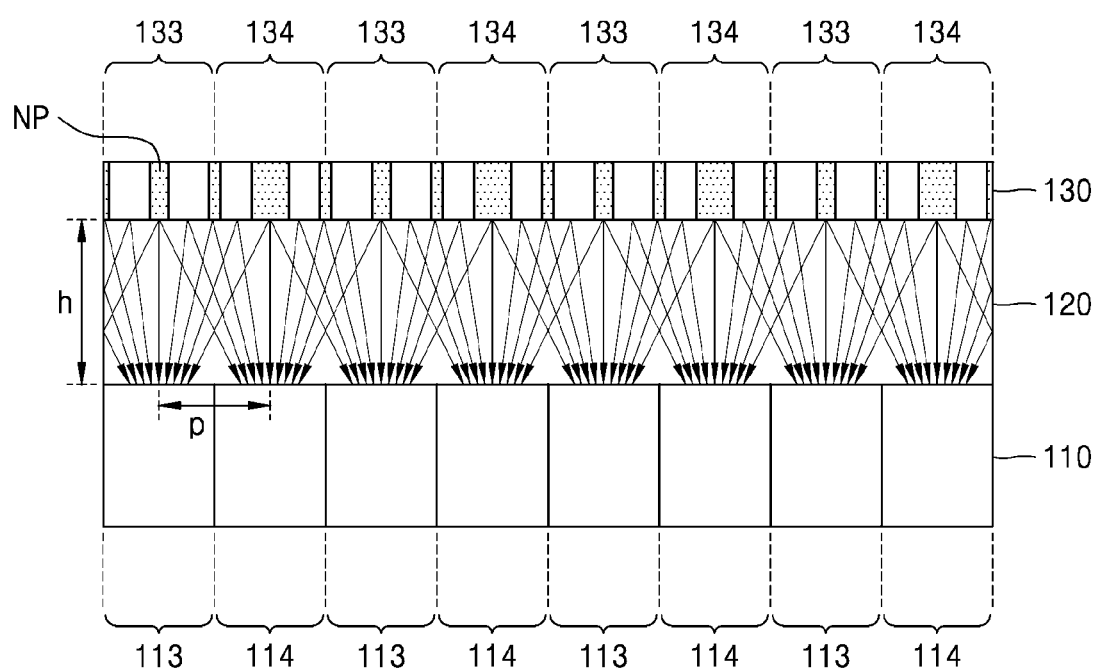
Figure 4:
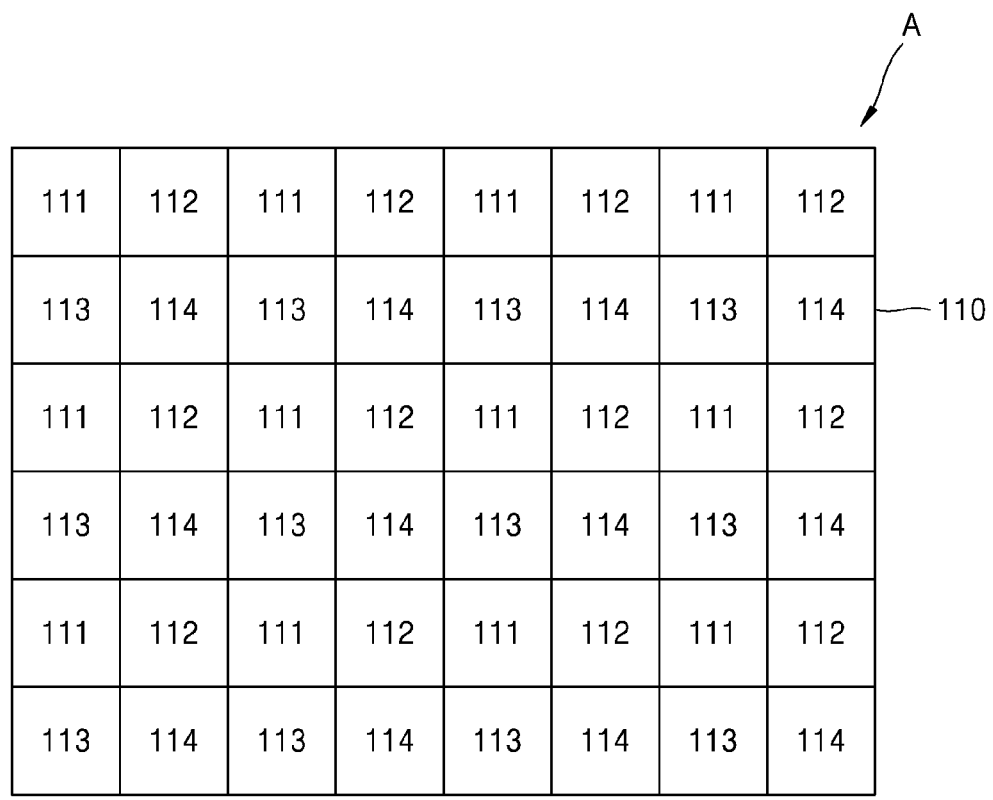
FIG. 4 is a plan view showing an arrangement of pixels in the pixel array of FIGS. 2A and 2B.
Figure 4:
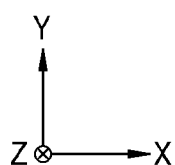
Figure 5A:
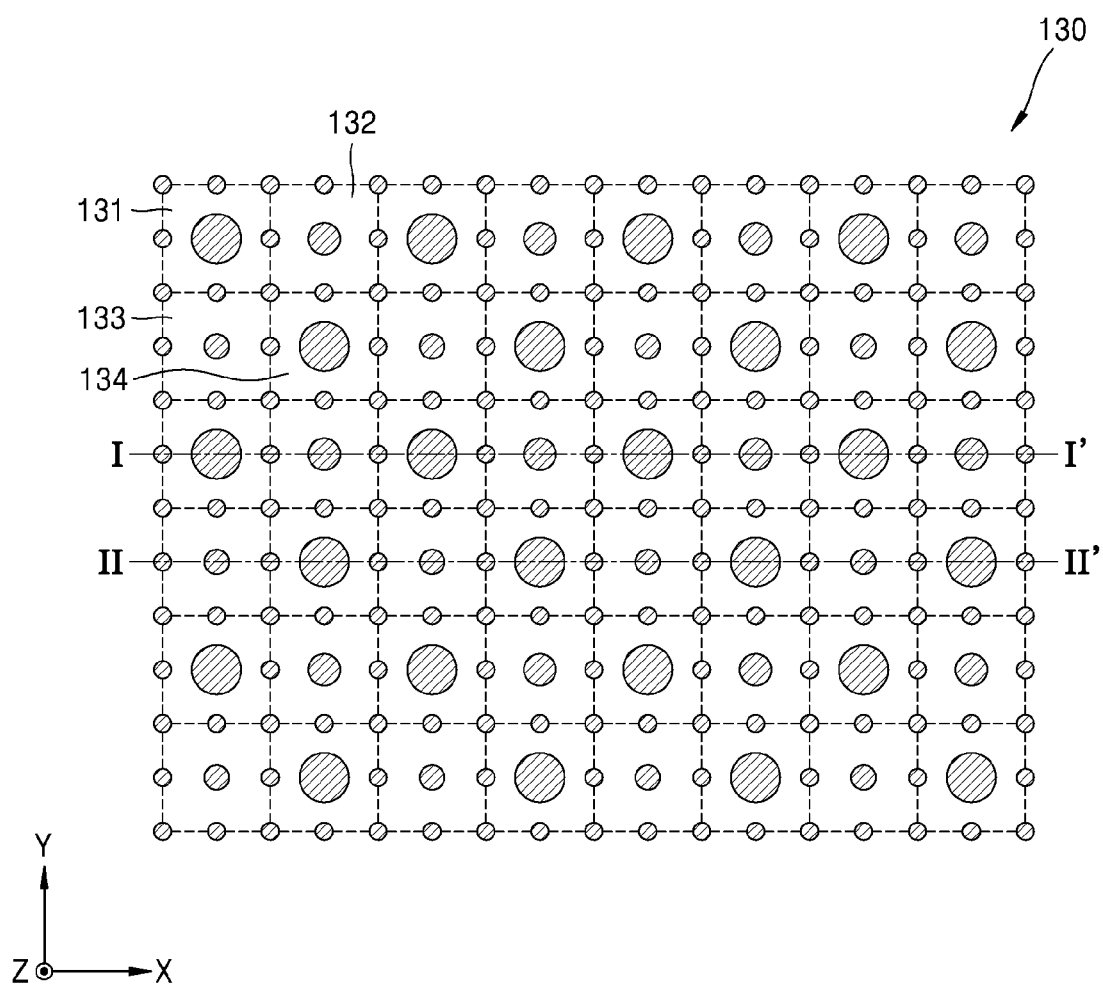
FIG. 5A is a plan view showing an example of arranging nanoposts in a color separating lens array.
Figure 5B:
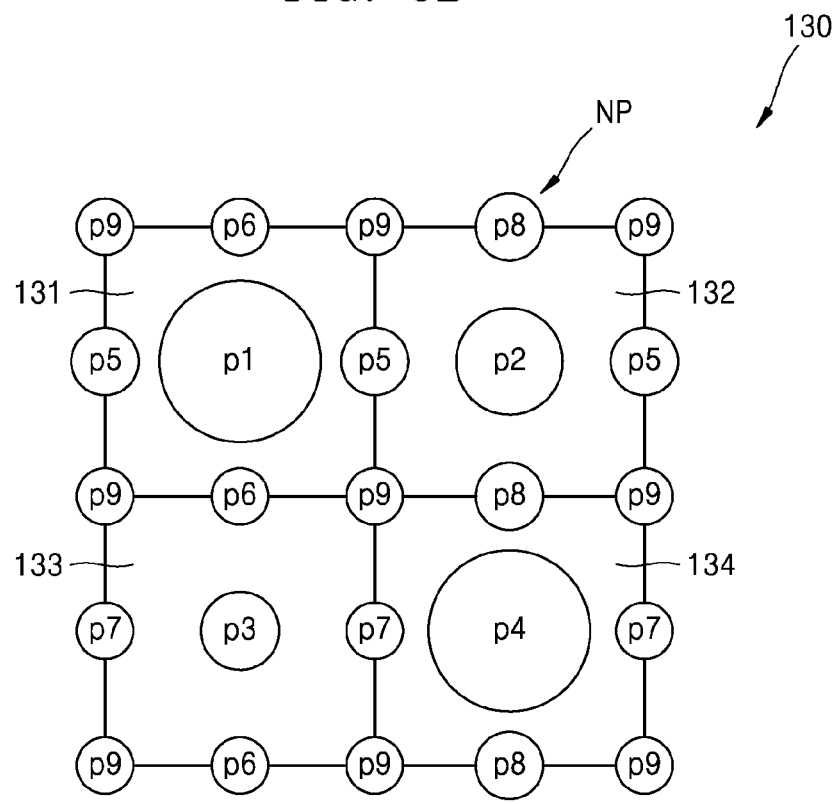
FIG. 5B is a plan view showing an enlarged view of a part in FIG. 5A.

FIGS. 3A and 3B are cross-sectional views of region A in the active pixel area 1110 of FIGS. 2A and 2B seen from different sections, FIG. 4 is a plan view showing the arrangement of pixels in the pixel array of FIGS. 2A and 2B, FIG. 5A is a plan view showing an example of arranging nanoposts in the color separating lens array, and FIG. 5B is a plan view showing an enlarged view of a portion in FIG. 5A.

Referring to FIGS. 3A and 3B, the pixel array 1100 of the image sensor 1000 may include a sensor substrate 110 including a plurality of pixels for sensing light, a transparent spacer layer 120 on the sensor substrate 110, and a color separating lens array 130 on the spacer layer 120.

The sensor substrate 110 may include the first to fourth pixels 111, 112, 113, and 114 converting light into electrical signals. The first to fourth pixels 111 to 114 may be arranged such that the first and second pixels 111 and 112 are alternately arranged in a first direction (X direction) as shown in FIG. 3A and the third and fourth pixels 113 and 114 may be alternately arranged in a different cross-section as shown in FIG. 3B. FIG. 4 shows pixels when the pixel array 1100 of the image sensor 1000 has a Bayer pattern. Such above arrangement is provided for separately sensing the incident light with unit patterns such as the Bayer pattern, for example, the first and fourth pixels 111 and 114 may sense light of the first wavelength, the second pixel 112 may sense light of the second wavelength, and the third pixel 113 may sense light of the third wavelength. Hereinafter, the light of the first wavelength is denoted as green light, the light of the second wavelength is blue light, and the light of the third wavelength is red light. In addition, the first and fourth pixels 111 and 114 may be a green pixel, the second pixel 112 may be a blue pixel, and the third pixel 113 may be a red pixel.

The pixel array 1100 may be disposed in various arrangement patterns, rather than the Bayer pattern. For example, a CYGM arrangement, in which a magenta pixel M, a cyan pixel, a yellow pixel, and a green pixel configure one unit pixel, may be used. Also, an RGBW arrangement, in which a green pixel, a red pixel, a blue pixel, and a white pixel configure one unit pattern, may be used. Also, the unit pixel may have a 3×2 array. Hereinafter, the description is provided under the assumption that the pixel array 1100 of the image sensor 1000 has the Bayer pattern.

The spacer layer 120 is disposed between the sensor substrate 110 and the color separating lens array 130 in order to maintain a distance between the sensor substrate 110 and the color separating lens array 130 constant. The spacer layer 120 may include a material transparent with respect to the visible ray, for example, a dielectric material having a lower refractive index than that of the nanoposts NP and low absorption coefficient in the visible ray band, e.g., $SiO_2$, siloxane-based spin on glass (SOG), etc. A thickness h of the spacer layer 120 may be selected within a range of $h_t-p \leq h \leq h_t+p$. Here, a theoretical thickness $h_t$ of the spacer layer 120 can be expressed as Equation 1 below, when a refractive index of the spacer layer 120 with respect to a wavelength $\lambda_0$ is n, and a pixel pitch is p which is measured from the center of one pixel to the center of an immediately adjacent pixel.

$$h_t = \frac{np^2}{\lambda_0} - \frac{\lambda_0}{4n} \qquad \text{[Equation 1]}$$

The theoretical thickness $h_t$ of the spacer layer 120 may refer to a focal length at which light having a wavelength of $\lambda_0$ is focused onto a top surface of the pixels 111, 112, 113, and 114 by the color separating lens array 130. $\lambda_0$ may denote a wavelength that is a reference for determining the thickness h of the spacer layer 120, and the thickness of the spacer layer 120 may be designed based on a central wavelength of the green light, that is, 540 nm.

Referring to FIG. 5A, the color separating lens array 130 may be partitioned into first to fourth regions 131, 132, 133, and 134 corresponding to the first to fourth pixels 111, 112, 113, and 114 of FIG. 4. The first to fourth regions 131, 132, 133, and 134 may respectively face the first to fourth pixels 111, 112, 113, and 114. For example, the first region 131 of the color separating lens array 130 may correspond to the first pixel 111, the second region may correspond to the second pixel 112, the third region 133 may correspond to the third pixel 113, and the fourth region 134 may correspond to the fourth pixel 114. The first to fourth regions 131, 132, 133, and 134 may be two-dimensionally arranged along the first direction (X direction) and the second direction (Y direction) such that a first row in which the first and second regions 131 and 132 are alternately arranged and a second row in which the third and fourth regions 133 and 134 are alternately arranged are alternately repeated. The color separating lens array 130 includes a plurality of unit patterns that are two-dimensionally arranged like the pixel array of the sensor substrate 110, and each of the unit patterns includes the first to fourth regions 131, 132, 133, and 134 arranged in a 2×2 array.

FIGS. 3A and 3B show an example in which the first to fourth regions 131, 132, 133, and 134 and the first to fourth pixels 111, 112, 113, and 114 have the same sizes and face each other in a vertical direction, but the color separating lens array 130 may be partitioned as a plurality of regions defined in different forms, e.g., a region for condensing the light of the first wavelength, a region for condensing light of the second wavelength, etc.

The color separating lens array 130 may include the nanoposts NP, of which sizes, shapes, intervals, and/or arrangements are defined, such that the light of the first wavelength is separated and condensed to the first and fourth pixels 111 and 114, the light of the second wavelength is separately condensed to the second pixel 112, and the light of the third wavelength is separately condensed to the third pixel 113. In addition, a thickness of the color separating lens array 130 in a third direction (Z direction) may be similar to or the same as heights of the nanoposts NP. For example, the thickness of the color separating lens array 130, and the heights of the nanoposts NP may be about 500 nm to about 1500 nm.

Referring to FIG. 5A, the first to fourth regions 131, 132, 133, and 134 may include the nanoposts NP having cylindrical shapes each having a circular cross-section. In a center portion of each region, the nanoposts NP having different cross-sectional areas are disposed, and the nanoposts NP may be also disposed at the center on a boundary between pixels and a crossing point between the pixel boundaries. The cross-sectional area of the nanoposts NP disposed at the boundary between pixels may be less than those of the nanoposts NP disposed at the center of the pixel.

FIG. 5B shows the arrangement of the nanoposts NP included in partial regions of FIG. 5A, that is, the first to fourth regions 131, 132, 133, and 134 in the unit pattern. In FIG. 5B, the nanoposts NP are indicated as p1 to p9 according to detailed locations thereof in the unit pattern. Referring to FIG. 5B, from among the nanoposts NP, a nanopost p1 on the center of the first area 131 and a nanopost p4 on the center of the fourth region 134 have greater cross-sectional areas than those of a nanopost p2 on the center of the second region 132 or a nanopost p3 on the center of the third region 133, and the nanopost p2 on the center of the second region 132 has a greater cross-sectional area than that of the nanopost p3 on the center of the third region 133. However, one or more embodiments are not limited to the above example, and if necessary, the nanoposts NP having various shapes, sizes, and arrangement may be applied.

The nanoposts NP included in the first and fourth regions 131 and 134 corresponding to the green pixel may have different distribution rules in the first direction (X direction) and the second direction (Y direction). For example, the nanoposts NP disposed in the first and fourth regions 131 and 134 may have different size arrangements in the first direction (X direction) and the second direction (Y direction). As shown in FIG. 5B, from among the nanoposts NP, a cross-sectional area of a nanopost p5 located at a boundary between the first region 131 and the second region 132 that is adjacent to the first region 131 in the first direction (X direction) is different from that of a nanopost p6 located at a boundary between the first region 131 and the third region 133 that is adjacent to the first region 131 in the second direction (Y direction). Likewise, a cross-sectional area of a nanopost p7 at the boundary between the fourth region 134 and the third region 133 that is adjacent to the fourth region 134 in the first direction (X direction) is different from that of a nanopost p8 located at the boundary between the fourth region 134 and the second region 132 that is adjacent to the fourth region 134 in the second direction (Y direction).

Meanwhile, the nanoposts NP disposed in the second region 132 corresponding to the blue pixel and the third region 133 corresponding to the red pixel R may have symmetrical distribution rules in the first and second directions (X direction and Y direction). As shown in FIG. 5B, from among the nanoposts NP, the cross-sectional area of the nanoposts p5 at a boundary between adjacent pixels that are adjacent to the second region 132 in the first direction (X direction) and the cross-sectional areas of the nanoposts p8 at a boundary between pixels adjacent to the second region 132 in the second direction (Y direction) are the same as each other, and in the third region 133, the cross-sectional areas of the nanoposts p7 at a boundary between adjacent pixels in the first direction (X direction) and the cross-sectional areas of the nanoposts p6 at a boundary between the adjacent pixels in the second direction (Y direction) are the same as each other.

In addition, the nanoposts p9 at four corners in each of the first to fourth regions 131, 132, 133, and 134, that is, points where the four regions cross one another, have the same cross-sectional areas from one another.

The above distribution is due to the pixel arrangement in the Bayer pattern. Adjacent pixels to the blue pixel and the red pixel in the first direction (X direction) and the second direction (Y direction) are the green pixels, whereas the adjacent pixel to the green pixel corresponding to the first region 131 in the first direction (X direction) is the blue pixel and adjacent pixel to the green pixel in the second direction (Y direction) is the red pixel. In addition, the adjacent pixel to the green pixel corresponding to the fourth region 134 in the first direction (X direction) is the red pixel and adjacent pixel to the green pixel in the second direction (Y direction) is the blue pixel. In addition, the same pixels, e.g., the green pixels are adjacent to four corners of the green pixels corresponding to the first and fourth regions 131 and 134, the same pixels, e.g., the blue pixels are adjacent to four corners of the blue pixel corresponding to the second region 132, and the same pixels, e.g., the blue pixels are adjacent to four corners of the red pixel corresponding to the third region 133. Therefore, in the second and third regions 132 and 133 corresponding to the blue pixel and the red pixel, the nanoposts NP may be arranged in the form of 4-fold symmetry, and in the first and fourth regions 131 and 134 corresponding to the green pixels, the nanoposts NP may be arranged in the form of 2-fold symmetry. In particular, the first and fourth regions 131 and 134 are rotated by 90° angle with respect to each other.

The plurality of nanoposts NP have symmetrical circular cross-sectional shapes in FIGS. 5A and 5B. However, some nanoposts having asymmetrical cross-sectional shapes may be included. For example, the first and fourth regions 131 and 134 corresponding to the green pixel employ the nanoposts having an asymmetrical cross-sectional shape that has different widths in the first direction (X direction) and the second direction (Y direction), and the second and third regions 132 and 133 corresponding to the blue pixel and the red pixel may employ the nanoposts having a symmetrical cross-sectional shape having the identical widths in the first direction (X direction) and the second direction (Y direction).

The arrangement rule of the color separating lens array 130 is an example for implementing a phase profile in which a light having a first wavelength is branched and focused onto the first and fourth pixels 111 and 114, a light having a second wavelength is branched and focused onto the second photosensitive pixel 112, and a light having a third wavelength is branched and focused onto the third pixel 113, and this arrangement rule is not limited to the illustrated patterns.

Figure 6A:
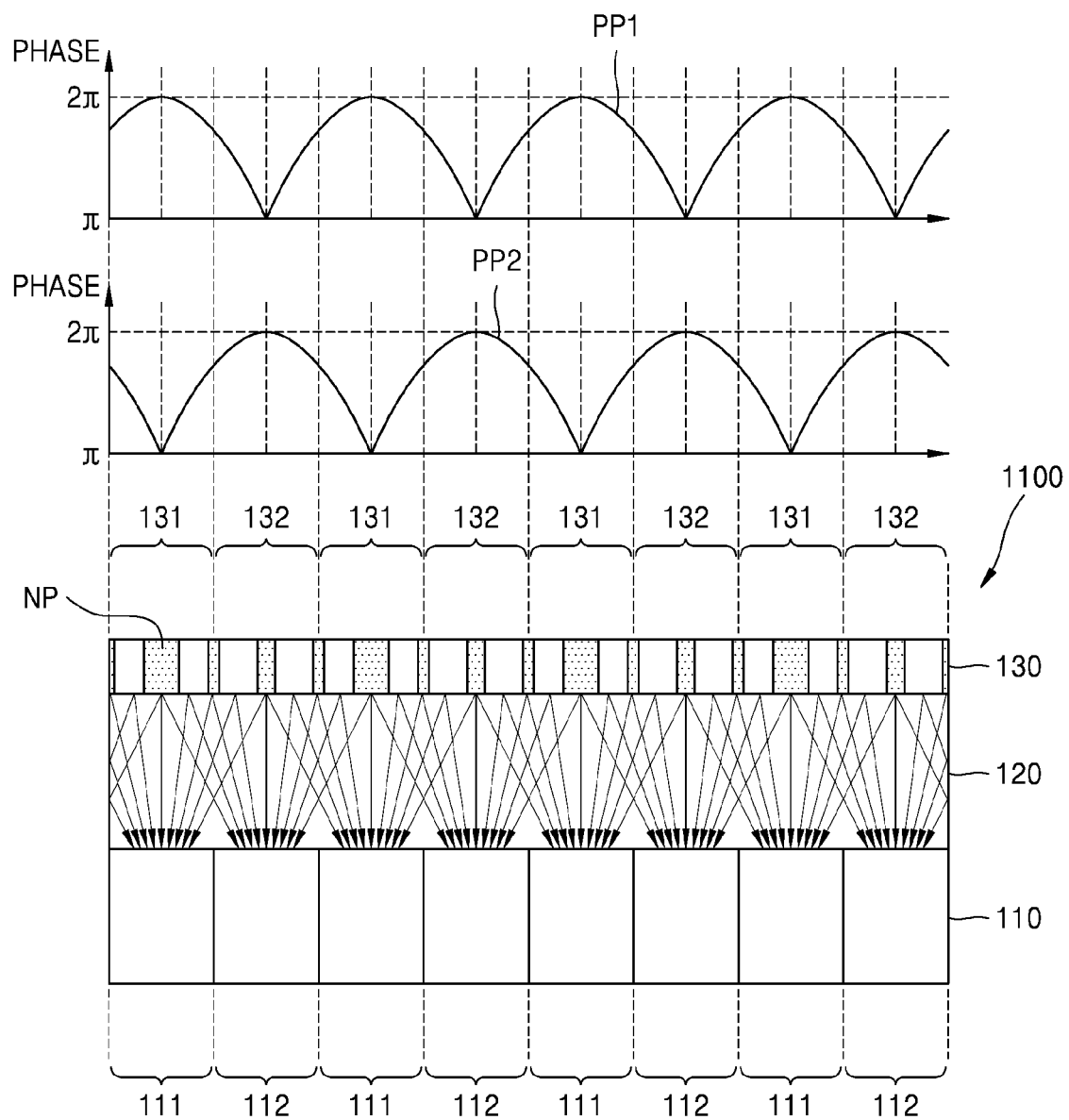
FIG. 6A is a diagram showing phase profiles, along line I-I' of FIG. 5A, of light of first wavelength and light of second wavelength that have passed through a color separating lens array.
Figure 6B:
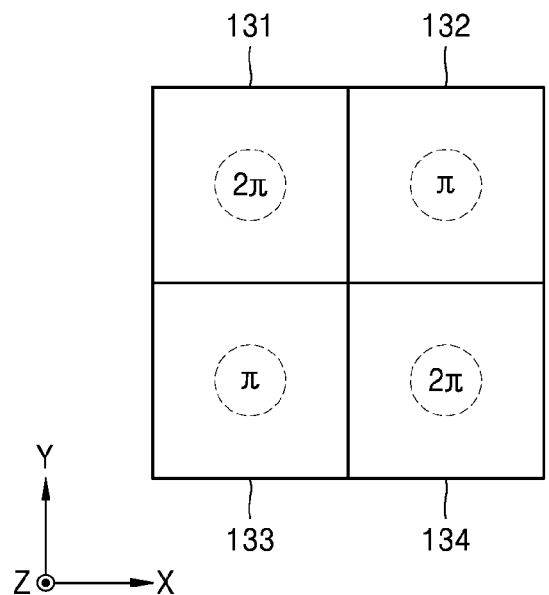
FIG. 6B is a diagram showing a phase of the light of the first wavelength that has passed through the color separating lens array at centers of first to fourth regions.
Figure 6C:
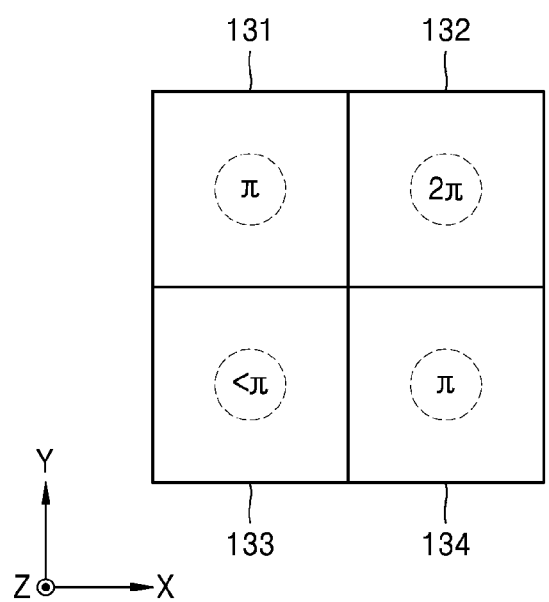
FIG. 6C is a diagram showing a phase of the light of the second wavelength that has passed through the color separating lens array at the centers of the first to fourth regions.

FIG. 6A is a diagram showing phase profiles, along line I-I' of FIG. 5A, of light of first wavelength and light of second wavelength that have passed through the color separating lens array 130, FIG. 6B is a diagram showing a phase of the light of the first wavelength that has passed through the color separating lens array 130 at centers of the first to fourth regions 131, 132, 133, and 134, and FIG. 6C is a diagram showing a phase of the light of the second wavelength that has passed through the color separating lens array 130 at the centers of the first to fourth regions 131, 132, 133, and 134.

Referring to FIGS. 6A and 6B, the light of the first wavelength that has passed through the color separating lens array 130 may have a first phase profile PP1 that is the largest at the center of the first region 131 and is reduced away from the center of the first region 131. In detail, immediately after passing through the color separating lens array 130, that is, at a lower surface of the color separating lens array 130 or an upper surface of the spacer layer 120, the phase of the light of the first wavelength is the largest at the center of the first region 131 and is reduced as a concentric circle away from the center of the first region 131. Thus, the phase is the smallest at the centers of the second and third regions 132 and 133 in the X and Y directions, and at contact points between the first region 131 and the fourth region 134 in the diagonal direction. When the phase of the light of the first wavelength emitted from the center of the first region 131 is set to $2\pi$ as a reference, light having a phase of $0.9\pi$ to $1.1\pi$ may be emitted from the centers of the second and third regions 132 and 133, light having a phase of $2\pi$ may be emitted from the center of the fourth region 134, and light having a phase of $1.1\pi$ to $1.5\pi$ may be emitted from a contact point between the first and fourth regions 131 and 134. In addition, the first phase profile PP1 may not denote that a phase delay amount of the light that has passed through the center of the first region 131 is the largest. When it is set that the phase of the light that has passed through the first region 131 is $2\pi$ and a phase value of the light that has passed through another position (when a phase delay amount of the light that has passed through another point is greater and has a phase value of $2\pi$ or greater) may denote a value remaining after subtracting $2n\pi$, that is, wrapped phase profile. For example, when the phase of light that has passed through the first region 131 is $2\pi$ and the phase of light that has passed through the center of the second region 132 is $3\pi$, the phase in the second region 132 may be a remaining $\pi$ after subtracting $2\pi$ (n=1) from $3\pi$.

Referring to FIGS. 6A and 6B, the light of the second wavelength that has passed through the color separating lens array 130 may have a second phase profile PP2 that is the largest at the center of the second region 132 and is reduced away from the center of the second region 132. In detail, immediately after passing through the color separating lens array 130, the phase of the light of the second wavelength is the largest at the center of the second region 132 and is reduced as the concentric circle away from the center of the second region 132, the phase is the smallest at the centers of the first and fourth regions 131 and 134 in the X direction and the Y direction and is the smallest at the center of the third region 133 in the diagonal direction. When a phase of the light of the second wavelength is $2\pi$ at the center of the second region 132, the phase of the light of the second wavelength is $0.9\pi$ to $1.1\pi$ at the centers of the first and fourth regions 131 and 134 and may be less than $\pi$ at the center of the third region 133, e.g., $0.2\pi$ to $0.9\pi$.

Figure 6D:
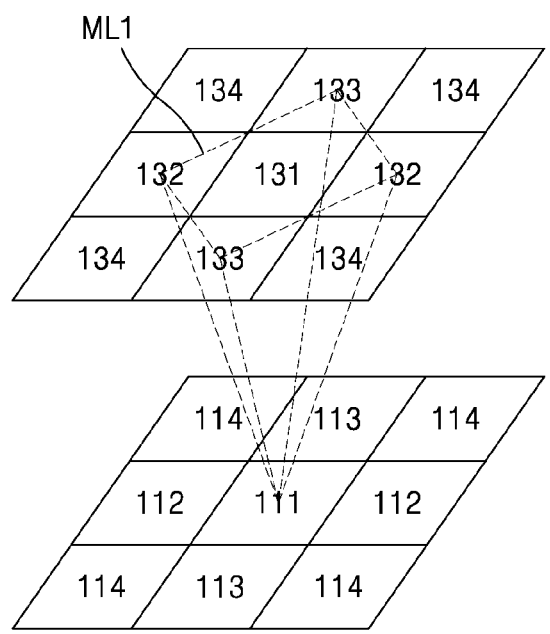
FIG. 6D shows an example of a travel direction of the light of the first wavelength incident on the first region and a periphery of the color separating lens array, the first region corresponding to the first pixel.
Figure 6E:
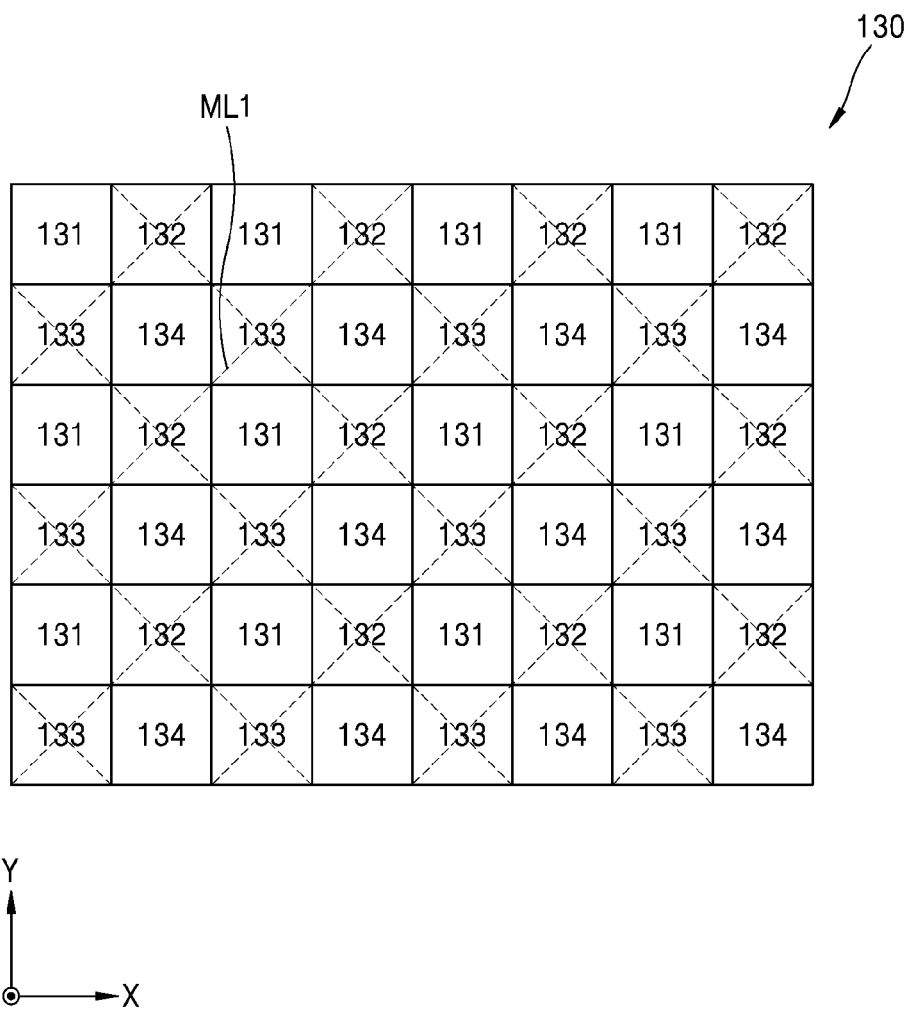
FIG. 6E shows an example of a microlens array equivalent to the color separating lens array with respect to the light of the first wavelength.

FIG. 6D shows an example of a travel direction of the light of the first wavelength incident on the first region 131 and a peripheral region of the color separating lens array 130, the first region 131 corresponding to the first pixel 111, and FIG. 6E shows an example of a microlens array equivalent to the color separating lens array 130 with respect to the light of the first wavelength.

The light of the first wavelength incident on the periphery of the first region 131 is condensed onto the first pixel 111 by the color separating lens array 130 as shown in FIG. 6D, and the light of the first wavelength is incident on the first pixel 111 from the first to third regions 131, 132, and 133. The phase profile of the light of the first wavelength illustrated with reference to FIGS. 6A and 6B is similar to a phase profile of light that has passed through a virtual first microlens ML1 that is generated by connecting the centers of two second regions 132 and two third regions 133 that are adjacent to the first region 131. Therefore, as shown in FIG. 6E, the color separating lens array 130 may be equivalent to an array of a plurality of first microlenses ML1 that are disposed based on the first region 131, with respect to the light of the first wavelength incident on the periphery of the first region 131. Each of the equivalent first microlenses ML1 has an area that is greater than that of corresponding first pixel 111, the light of the first wavelength incident on the second and third regions 132 and 133, as well as the light of the first wavelength incident on the first region 131, may be also condensed onto the first pixel 111. The area of the first microlens ML1 may be 1.2 to 2 times greater than that of the corresponding first pixel 111.

Figure 6F:
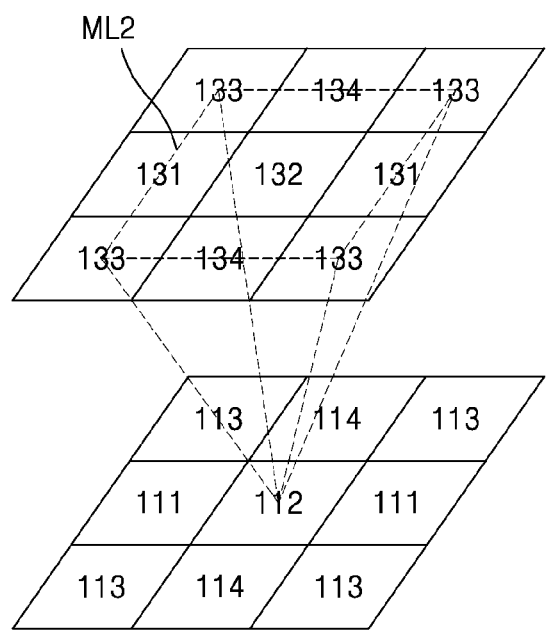
FIG. 6F shows an example of a travel direction of the light of the second wavelength incident on a second region and a periphery in the color separating lens array, the second region corresponding to the second pixel.
Figure 6G:
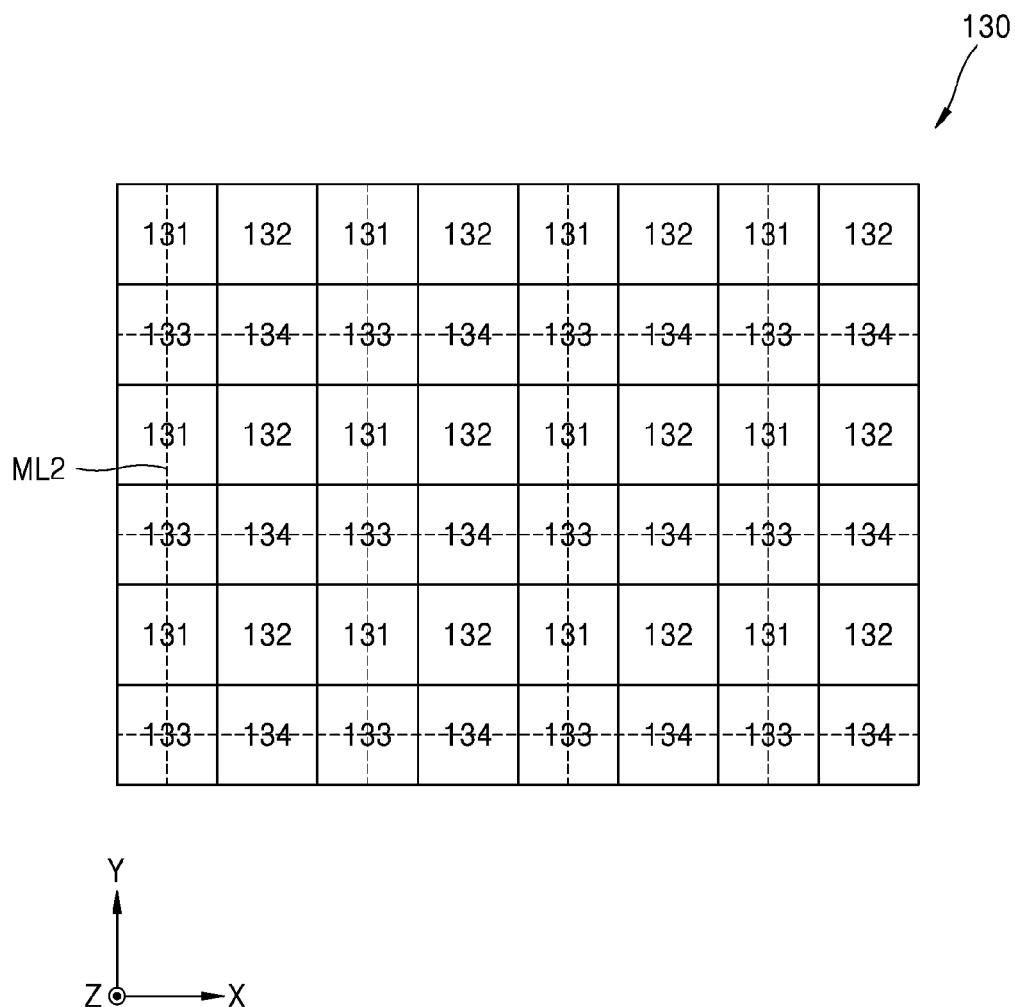
FIG. 6G shows an example of a microlens array equivalent to the color separating lens array with respect to the light of the second wavelength.

FIG. 6F shows an example of a travel direction of the light of the second wavelength incident on the second region 132 and a peripheral region of the color separating lens array 130, wherein the second region 132 corresponds to second pixel 112, and FIG. 6G shows an example of a microlens array equivalent to the color separating lens array 130 with respect to the light of the second wavelength.

The light of the second wavelength is condensed onto the second pixel 112 by the color separating lens array 130 as shown in FIG. 6F, and the light of the second wavelength from the first to fourth regions 131, 132, 133, and 134 is incident on the second pixel 112. The phase profile of the light of the second wavelength illustrated with reference to FIGS. 6A and 6C is similar to a phase profile of light that has passed through a virtual second microlens ML2 that is generated by connecting the centers of four third regions that are adjacent to the second region 132 by apexes. Therefore, as shown in FIG. 6G, the color separating lens array 130 may be equivalent to an array of a plurality of second microlenses ML2 disposed around the second region 132, with respect to the light of the second wavelength. Because each of the second microlenses ML2 is greater than the corresponding second pixel 112, the light of the second wavelength incident in the direction toward the first, third, and fourth pixels 111, 113, and 114, as well as the light of the second wavelength incident in the direction toward the second pixel 112, may be also condensed to the second pixel 112. The area of the second microlens ML2 may be 1.5 to 4 times greater than that of the corresponding second pixel 112.

Figure 7A:
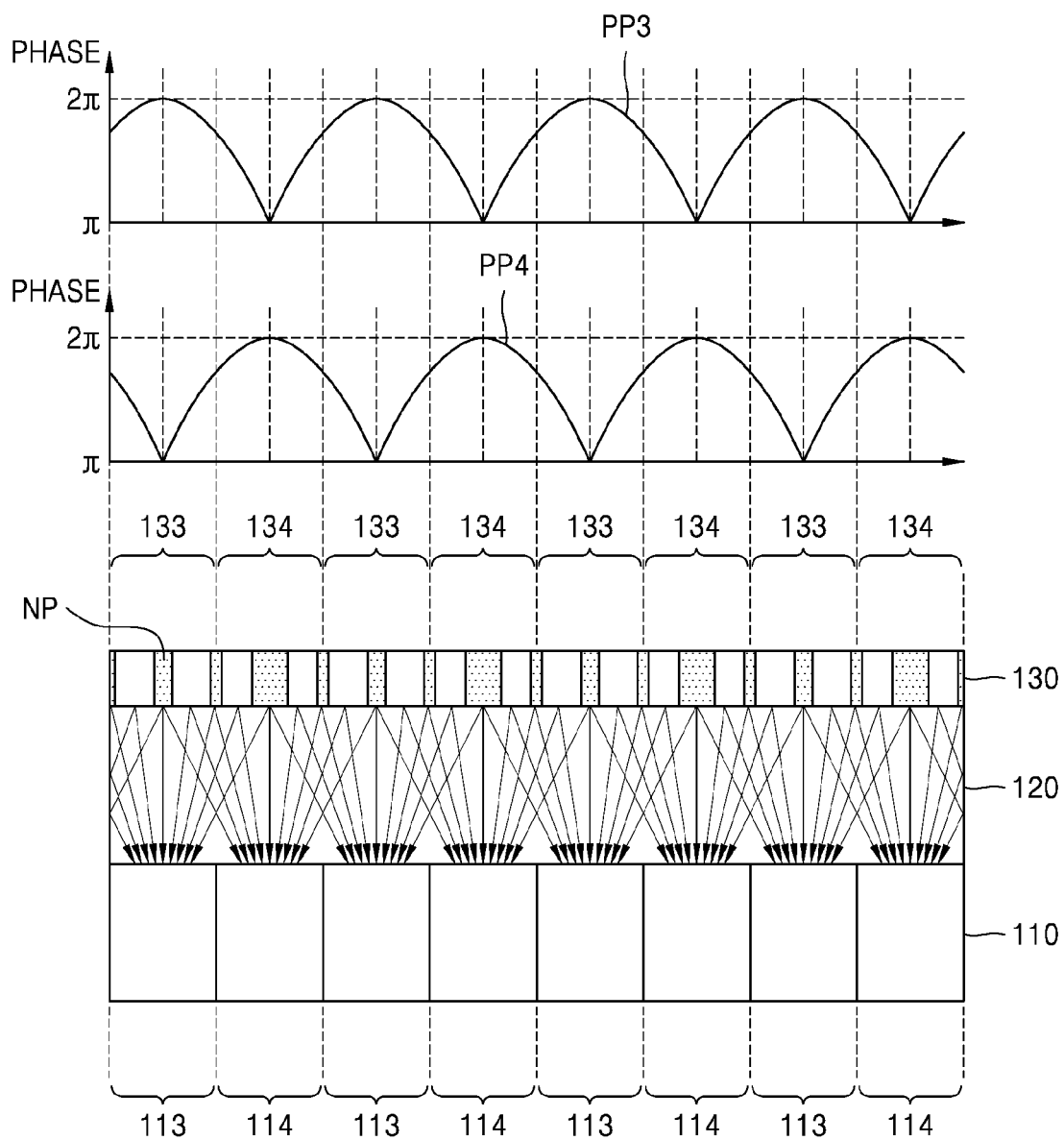
FIG. 7A is a diagram showing phase profiles of light of first wavelength and light of third wavelength that have passed through a color separating lens array along line II-II' of FIG. 5A.
Figure 7B:
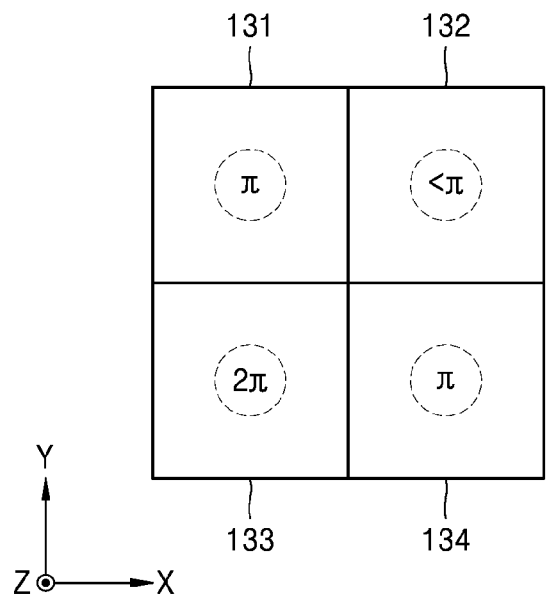
FIG. 7B is a diagram showing a phase of the light of the third wavelength that has passed through the color separating lens array at centers of first to fourth regions.
Figure 7C:
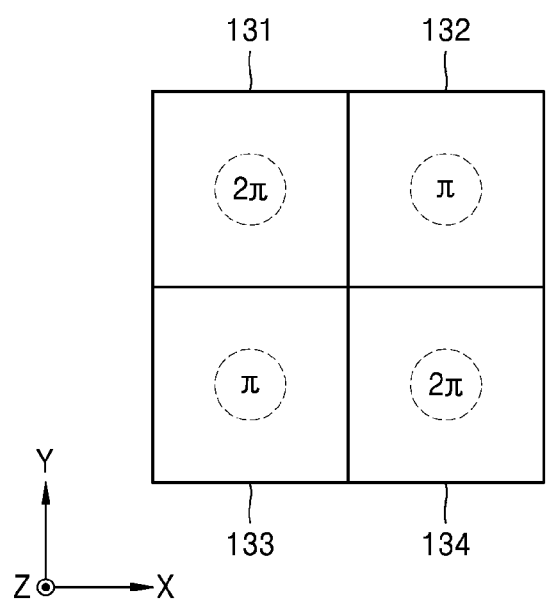
FIG. 7C is a diagram showing a phase of the light of the first wavelength that has passed through the color separating lens array at the centers of the first to fourth regions.

FIG. 7A shows phase profiles of light of the first wavelength and light of the third wavelength that have passed through the color separating lens array 130 in line II-II' of FIG. 5A, FIG. 7B shows the phase of the light of the third wavelength that has passed through the color separating lens array 130 at centers of the first to fourth regions 131, 132, 133, and 134, and FIG. 7C shows the phase of the light of the first wavelength that has passed through the color separating lens array 130 at the centers of the first to fourth regions 131, 132, 133, and 134.

Referring to FIGS. 7A and 7B, the light of the third wavelength that has passed through the color separating lens array 130 may have a phase profile that is similar to that of the light of the second wavelength described above based on the second region 132, and may have a third phase profile PP3 that is the largest at the center of the third region and is reduced away from the center of the third region 133. In detail, immediately after passing through the color separating lens array 130, the phase of the light of the third wavelength is the largest at the center of the third region 133 and is reduced as the concentric circle away from the center of the third region 133, and the phase is the smallest at the centers of the first and fourth regions 131 and 134 in the X direction and the Y direction and is the smallest at the center of the second region 132 in the diagonal direction. When a phase of the light of the third wavelength is $2\pi$ at the center of the third region 133, the phase of the light of the third wavelength is $0.9\pi$ to $1.1\pi$ at the centers of the first and fourth regions 131 and 134 and may be less than $\pi$ at the center of the second region 132, e.g., $0.2\pi$ to $0.9\pi$.

Figure 7D:
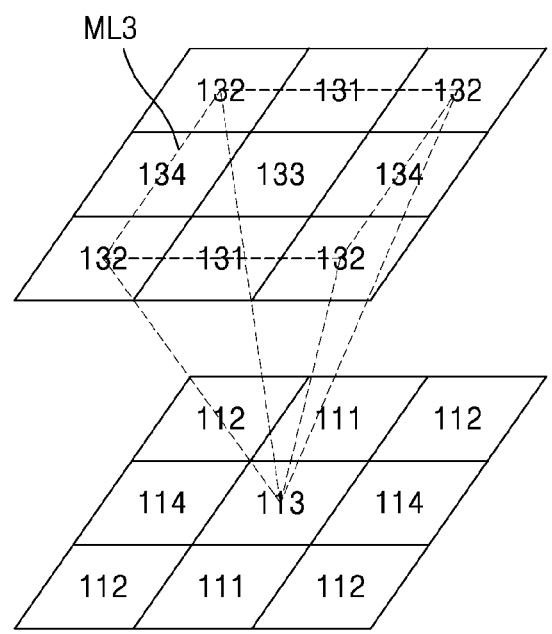
FIG. 7D shows an example of a travel direction of the light of the third wavelength incident on the third region and a periphery in the color separating lens array, the third region corresponding to a third pixel.
Figure 7E:
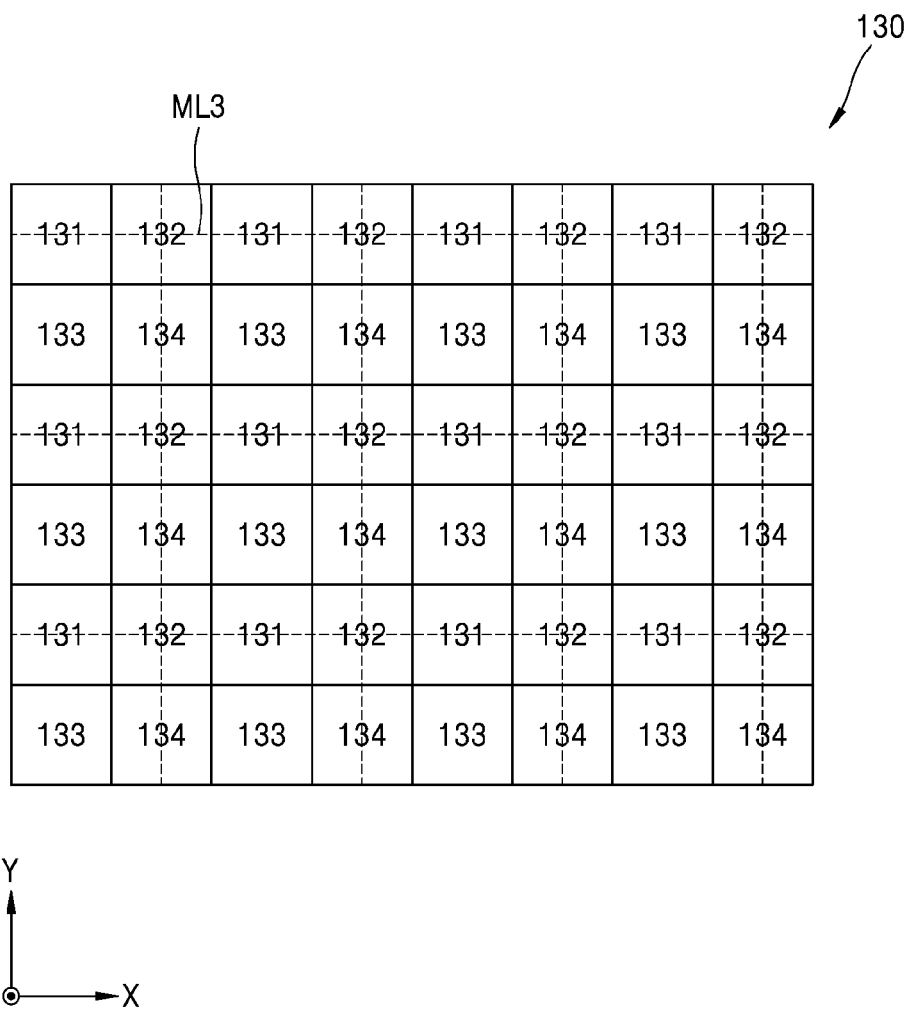
FIG. 7E shows an example of a microlens array equivalent to the color separating lens array with respect to the light of the third wavelength.

FIG. 7D shows an example of a travel direction of the light of the third wavelength incident on the third region 133 and a peripheral region of the color separating lens array 130, wherein the third region 133 corresponds to the third pixel 113, and FIG. 7E shows an example of a microlens array equivalent to the color separating lens array 130 with respect to the light of the third wavelength.

The light of the third wavelength is condensed onto the third pixel 113 by the color separating lens array 130 as shown in FIG. 7D, and the third wavelength light from the first to fourth regions 131, 132, 133, and 134 is incident on the third pixel 113. The phase profile of the light of the third wavelength illustrated with reference to FIGS. 7A and 7B is similar to a phase profile of light that has passed through a virtual third microlens ML3 that is generated by connecting the centers of four second regions 132 that are adjacent to the third region 133 by apexes. Therefore, as shown in FIG. 7E, the color separating lens array 130 may be equivalent to an array of a plurality of third microlenses ML3 disposed around the third pixel 113, with respect to the light of the third wavelength. Because each of the third microlenses ML3 is greater than the corresponding third pixel 113, the light of the third wavelength incident in the direction toward the first, second, and fourth pixels 111, 112, and 114, as well as the light of the third wavelength incident in the direction toward the third pixel 113, may be also condensed to the third pixel 113. The area of the third microlens ML3 may be 1.5 to 4 times greater than that of the corresponding third pixel 113.

Referring to FIGS. 7A and 7C, the light of the first wavelength incident on a periphery of the fourth region 134 may have a phase profile that is similar to that of the light of the first wavelength described above based on the first region 131, and may have a fourth phase profile PP4 that is the largest at the center of the fourth region 134 and is reduced away from the center of the fourth region 134. Immediately after passing through the color separating lens array 130, the phase of the light of the first wavelength based on the fourth region 134 is the largest at the center of the fourth region 134 and is reduced as the concentric circle away from the center of the fourth region 134, and the phase is the smallest at the centers of the second and third regions 132 and 133 in the X direction and the Y direction and is the smallest at a contact point between the first and fourth regions 131 and 134 in the diagonal direction. When the phase of the light of the first wavelength is $2\pi$ at the center of the fourth region 134, the phase may be $0.9\pi$ to $1.1\pi$ at centers of the second and third regions 132 and 133, $2\pi$ at the center of the first region 131, and $1.1\pi$ to $1.5\pi$ at the contact point between the first and fourth regions 131 and 134.

Figure 7F:
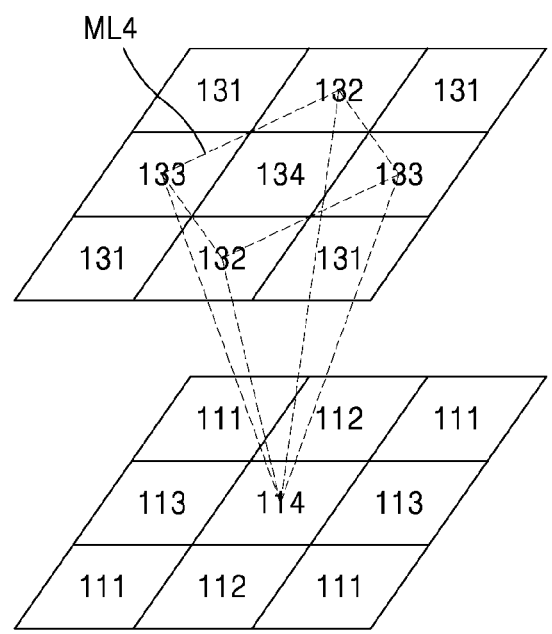
FIG. 7F shows an example of a travel direction of the light of the first wavelength incident on a fourth region and a periphery.
Figure 7G:
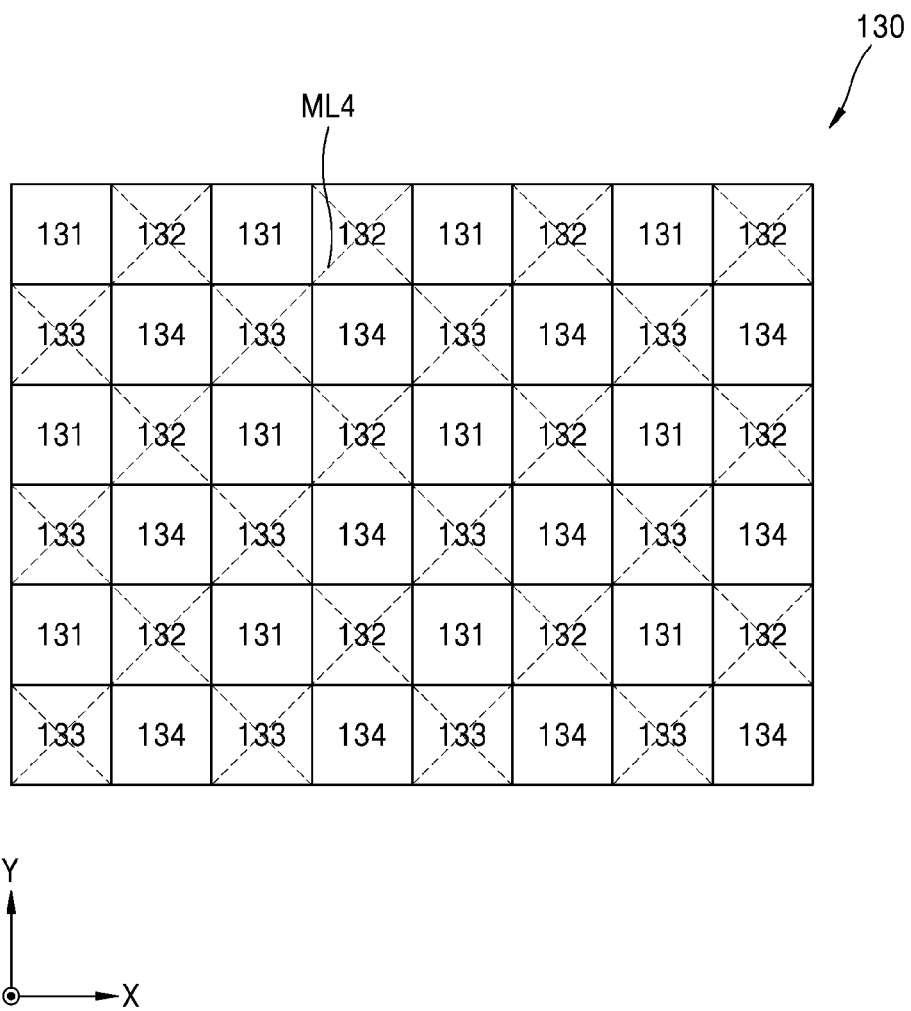
FIG. 7G shows an example of the microlens array equivalent to a color separating lens array with respect to the first wavelength light.

FIG. 7F shows an example of a travel direction of the light of the first wavelength incident on the fourth region 134 and the periphery, and FIG. 7G shows an example of the microlens array equivalent to the color separating lens array 130 with respect to the light of the first wavelength. The light of the first wavelength is condensed to two pixels, e.g., 111 and 114, and the phase profile of the light of the first wavelength and the travel direction of the light of the first wavelength incident on the fourth region 134 are similar to those of the light of the first wavelength incident on the first region 131. Thus, redundant descriptions are omitted.

Referring to FIG. 7F, the light of the first wavelength incident on the periphery of the fourth region 134 is condensed onto the fourth pixel 114 by the color separating lens array 130, and the light of the first wavelength is incident on the fourth pixel 114 from the second to fourth regions 132, 133, and 134. As shown in FIG. 7G, the color separating lens array 130 may be equivalent to an array of a plurality of fourth microlenses ML4 that are disposed based on the fourth pixel 114, with respect to the light of the first wavelength incident on the periphery of the fourth region 134.

Figure 8:
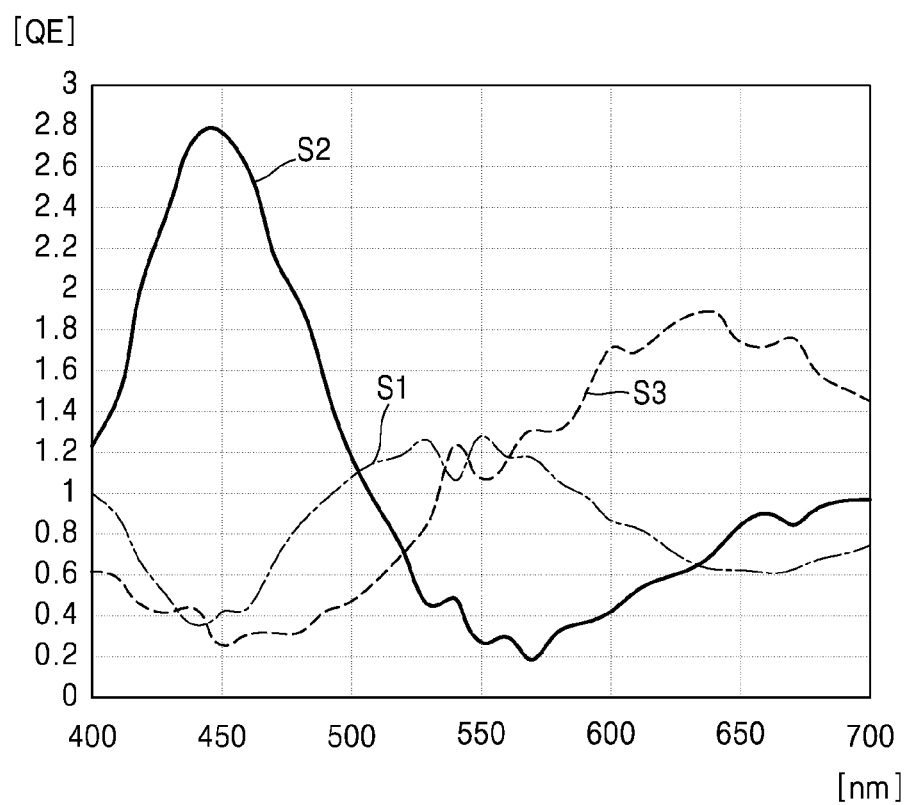
FIG. 8 shows spectra of light incident on a sensor substrate through the color separating lens array of FIGS. 3A and 3B.

FIG. 8 shows a spectrum of light incident on the sensor substrate through the color separating lens array 130 of FIGS. 3A and 3B.

In FIG. 8, a vertical axis represents quantum efficiency (QE) and a horizontal axis represents a wavelength of light. QE indicates a degree of converting photons incident on the pixel array 1100 into electrons by a photoelectric conversion element, for example, when incident photons are converted into electrons with 80% efficiency, QE is 0.8, and when incident photons are converted into electrons with 100% efficiency, QE is 1.0. In a general pixel array, QE does not exceed 1.0, but the pixel array of FIGS. 3A and 3B includes the color separating lens array 130, QE may be 1.0 or greater. For example, when a QE of the second pixel 112 is 2.0 with respect to a wavelength of 475 nm, electrons corresponding to 200 photons are generated in the second pixel 112 when the number of photons of the light having 475 nm wavelength traveling toward the second pixel 112 is 100. In the pixel array of FIGS. 3A and 3B, photons of the 475 nm wavelength light traveling toward the first and third pixels 111 and 113, as well as the photons of 475 nm wavelength light traveling toward the second pixel 112, are incident on the second pixel 112, and thus, QE may be 1.0 or greater. In other words, the amount of photons of the 475 nm wavelength light incident on the second pixel 112 after passing through the color separating lens array 130 may be greater than that of the photons of the 475 nm wavelength light traveling toward the second pixel 112 before passing through the color separating lens array 130, and thus, QE of the second pixel 112 with respect to the 475 nm wavelength light may be greater than 1.0.

A first spectrum 51 of FIG. 8 is a spectrum of the light that is incident on the pixel array 1100 and branched by the color separating lens array 130 and then sensed by the first and fourth pixels 111 and 114 that are green pixels, and QE of a wavelength band from 490 nm to 580 nm, which corresponds to the green light, is the greatest. A second spectrum S2 shows a spectrum of light sensed by the second pixel 112, e.g., the blue pixel, and QE of a wavelength band from 420 nm 475 nm, which corresponds to the blue light, is the greatest. A third spectrum S3 shows a spectrum of light sensed by the third pixel 113, e.g., the red pixel, and QE of a wavelength band from 590 nm to 680 nm, which corresponds to the red light, is the greatest.

The color separating lens array 130 shown in FIG. 5A is an example, and various types of color separating lens arrays 130 may be designed according to a color characteristic, a pixel pitch, an incident angle of the incident light into the image sensor, etc. Also, it is described that the color separating lens array 130 includes a plurality of cylindrical nanoposts NP that are spaced apart from one another, but one or more embodiments are not limited thereto. For example, FIG. 9A is a plan view showing a unit pattern shape in a color separating lens array that may be applied to an image sensor of Bayer pattern type, and FIG. 9B is a plan view showing a unit pattern shape in another color separating lens array.

Figure 9A:
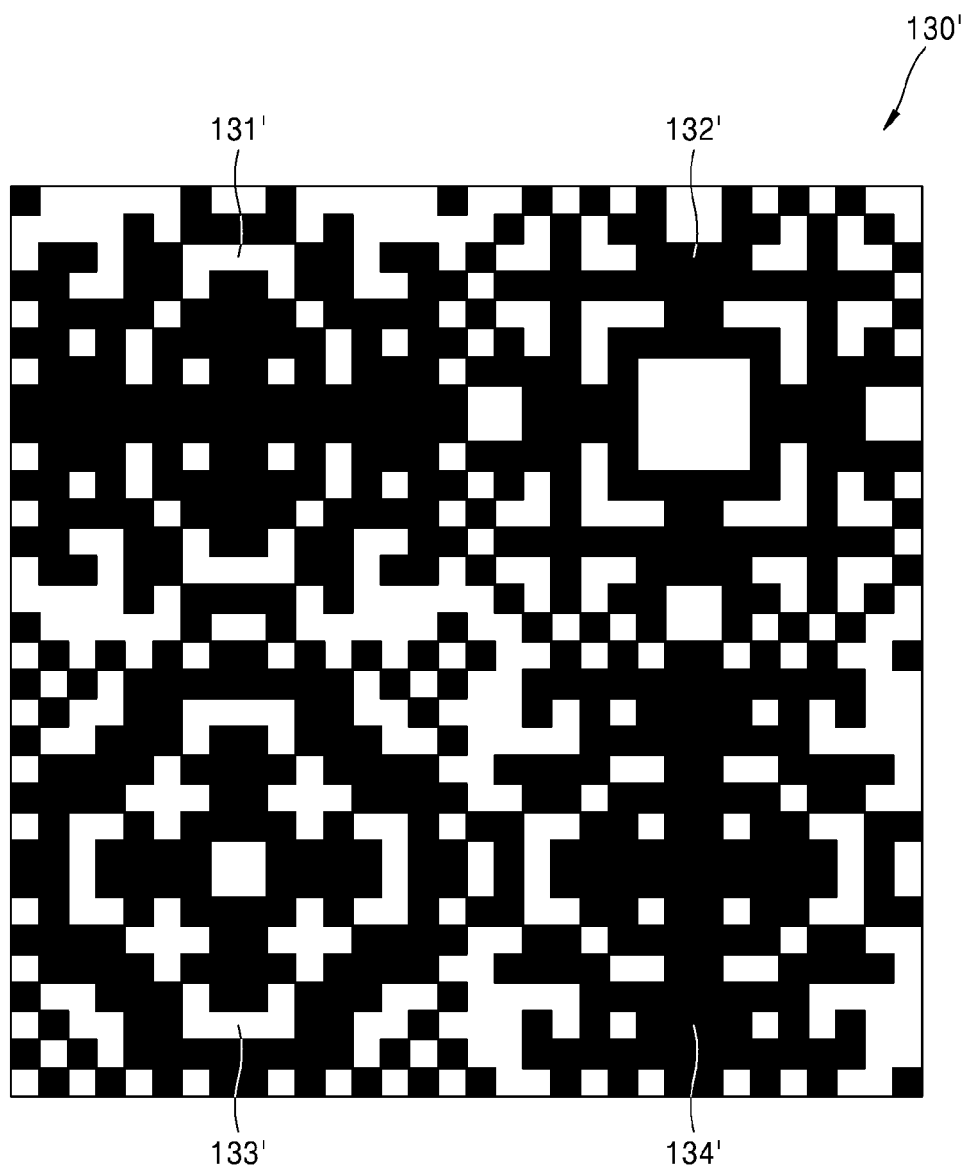
FIG. 9A is a plan view showing an example of a shape of a unit pattern in a color separating lens array according to another example embodiment, which may be applied to an image sensor of Bayer pattern type.
Figure 9B:
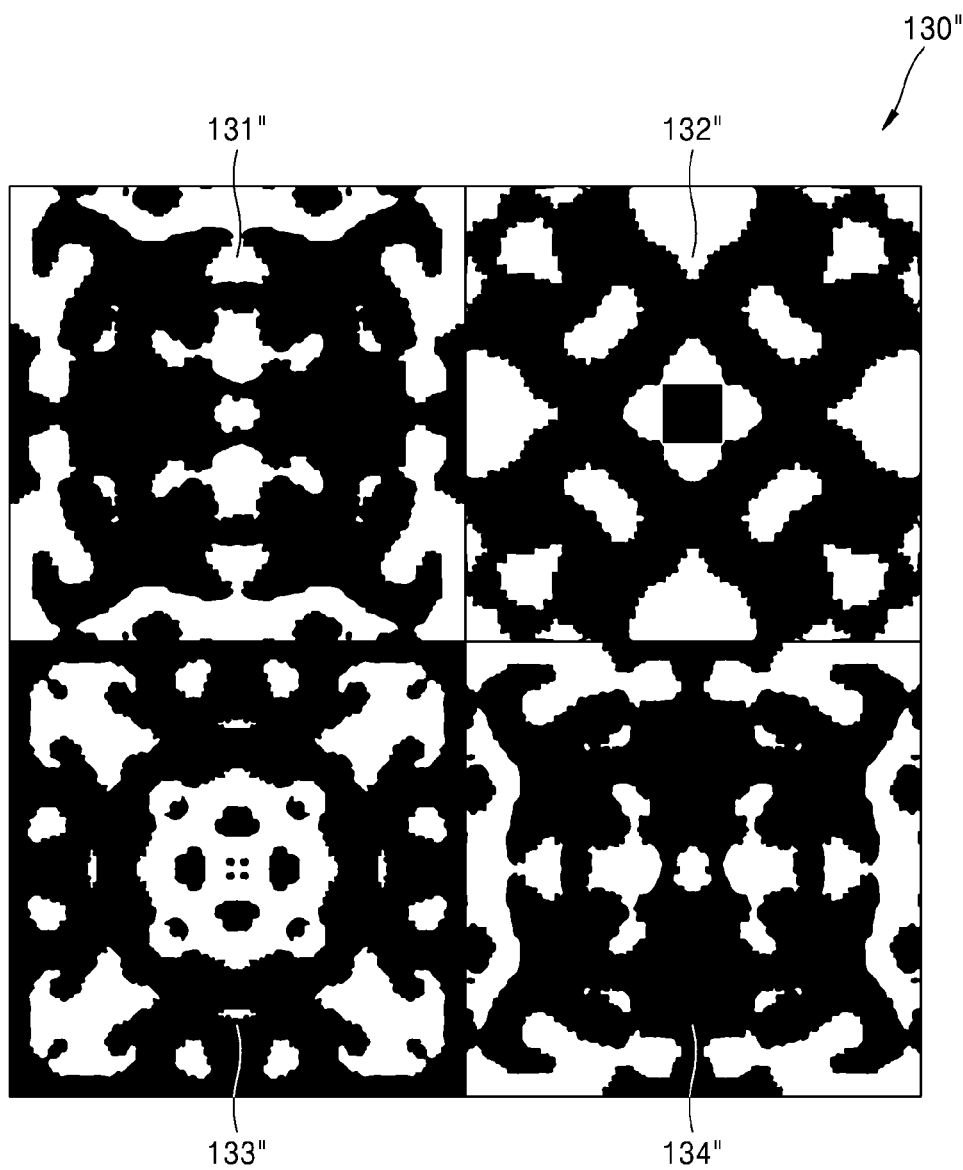
FIG. 9B is a plan view showing an example of a shape of a unit pattern in a color separating lens array according to another example embodiment.

In a color separating lens array 130' of FIG. 9A, each of first to fourth regions 131', 132', 133', and 134' is optimized in a digitalized binary form of 16×16 rectangular arrays, and the unit pattern has a shape of 32×32 rectangular arrays. Unlike the above example, each of first to fourth regions 131", 132", 133", and 134" in a color separating lens array 130" shown in FIG. 9B has a non-digitalized continuous curve shape.

The color separating lens array 130, 130', or 130" satisfying the above phase profile and performance described above may be automatically designed through various types of computer simulations. For example, the structure of the first to fourth regions 131, 132, 133, and 134, 131', 132', 133', and 134', or 131", 132", 133", and 134" may be optimized through a nature-inspired algorithm such as a genetic algorithm, a particle swarm optimization algorithm, an ant colony optimization algorithm, etc., or a reverse design based on an adjoint optimization algorithm.

According to the design of the color separating lens array 130, 130', or 130", first to fourth structures of the first to fourth regions 131, 132, 133, and 134, 131', 132', 133', and 134', or 131", 132", 133", and 134" may be optimized while evaluating performances of candidate color separating lens arrays based on evaluation factors such as a color separating spectrum, optical efficiency, a signal-to-noise ratio, etc. For example, the structures of the first to fourth regions 131, 132, 133, and 134, 131', 132', 133', and 134', or 131", 132", 133", and 134" may be optimized in a manner that a target numerical value of each evaluation factor is determined in advance and the sum of the differences from the target numerical values of a plurality of evaluation factors is reduced. Alternatively, when performance for each evaluation factor is indicated, the structures of the first to fourth regions 131, 132, 133, and 134, 131', 132', 133', and 134', or 131", 132", 133", and 134" may be optimized such that the value indicating the performance may be maximized.

Figure 10A:
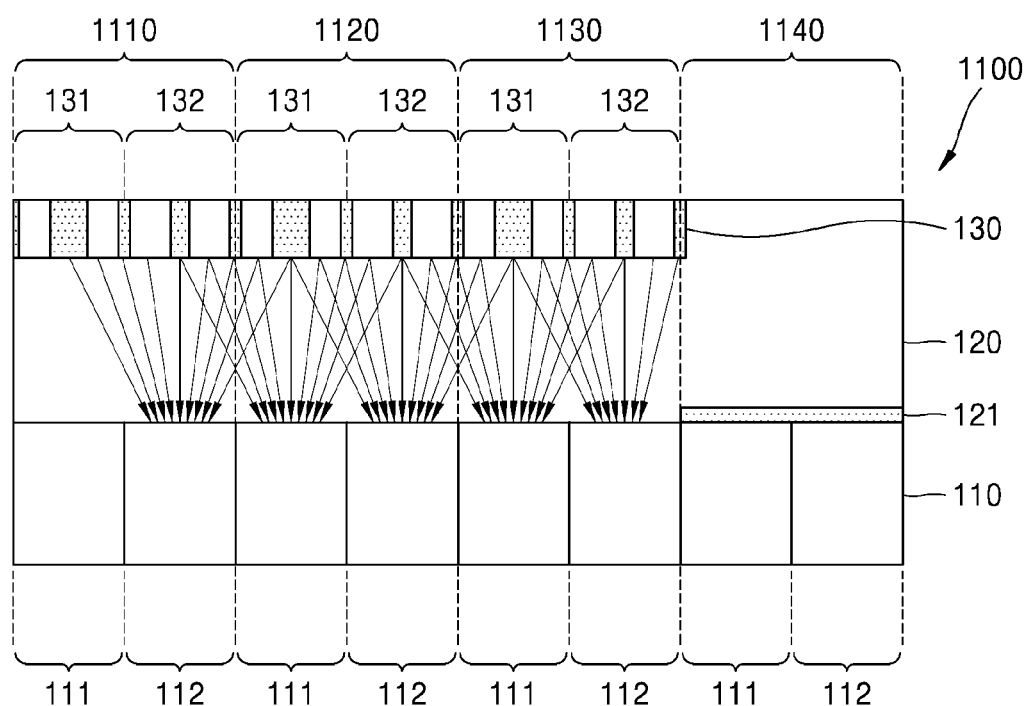
FIG. 10A is a cross-sectional view of a region B in FIGS. 2A and 2B.
Figure 10B:
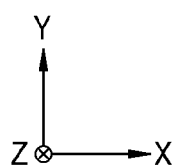
FIG. 10B is a plan view of a sensor substrate of FIG. 10A.

FIG. 10A is a cross-sectional view of a region B in FIGS. 2A and 2B, and FIG. 10B is a plan view of a sensor substrate of FIG. 10A.

The region B of FIGS. 2A and 2B is different from a region A of FIGS. 2A and 2B in that the region B includes an active pixel area 1110, a first dummy pixel area 1120, a second dummy pixel area 1130, and the optical black area 1140 in the pixel array 1100, whereas the region A only includes the active pixel area 1110.

The first dummy pixel area 1120 is, as described above, an area where the pixels for outputting signals that are indirectly used in the image generation are formed, and is disposed to surround the active pixel area 1110 on an outside of the active pixel area 1110. The first dummy pixel area 1120 has similar structure and operations to those of the active pixel area 1110 described above with reference to FIGS. 3A and 3B, and redundant descriptions are omitted.

The second dummy pixel area 1130 is an area for providing a passage of the light incident on the pixels formed in the first dummy pixel area 1120, and may be disposed to surround the first dummy pixel area 1120 on an outside of the first dummy pixel area 1120. The second dummy pixel area 1130 has a similar structure to those of the active pixel area 1110 and the first dummy pixel area 1120 in view of including the sensor substrate 110, the spacer layer 120, and the color separating lens array 130, but is different from the active pixel area 1110 and the first dummy pixel area 1120 in that the pixels included in the second dummy pixel area 1130 do not output pixel signals. In detail, the second dummy pixel area 1130 is provided to extend the color separating lens array 130 to an outer side of the first dummy pixel area 1120, such that portion of the light that has passed through the color separating lens array 130 in the second dummy pixel area 1130 (i.e., the color separating lens array 130 that is positioned directly above the pixels in the second dummy pixel area 1130) may be incident on the pixels disposed in the first dummy pixel area 1120.

For example, portion of the blue light incident on the first region 131 of the color separating lens array 130 in the second dummy pixel area 1130 shown in FIG. 10A is condensed onto the second pixel 112 of the first dummy pixel area 1120, and thus, the second pixel 112 in the first dummy pixel area 1120 may receive the light under the same condition as the second pixels 112 of the active pixel area 1110. When there is no color separating lens array 130 in the second dummy pixel area 1130, the blue light incident on the first region 131 of the second dummy pixel area 1130 is not condensed onto the second pixel 112 of the first dummy pixel area 1120, and thus, the second pixel 112 of the first dummy pixel area 1120 may not receive the light under the same condition as that of the second pixel 112 in the active pixel area 1110. As described above, in order to use the pixel signal of the first dummy pixel area 1120 to correct the pixel signal of the active pixel area 1110 or to focus the image sensor, the first dummy pixel area 1120 has to be able to receive the incident light under the same condition as that of the active pixel area 1110, and in order to satisfy the condition, the second dummy pixel area 1130 may be necessary.

The second dummy pixel area 1130 may prevent the contamination of the first dummy pixel area 1120 from the process of forming the optical black area 1140, as well as providing the optical path of the light incident on the first dummy pixel area 1120.

The optical black area 1140 is an area in which pixels outputting pixel signals under no incident light, that is, black level or dark level signals, are arranged, and may be disposed to surround the second dummy pixel area 1130 on an outside of the second dummy pixel area 1130. The optical black area 1140 may include the sensor substrate 110, the spacer layer 120, and the light-shielding layer 121.

The light shielding layer 121 is formed on the pixels 111 and 112 included in the optical black area 1140, and may shield the light incident on the pixels 111 and 112. The light-shielding layer 121 may include metal such as copper, tungsten, etc.

The color separating lens array 130 may be formed in the optical black area 1140, but since the optical black area 1140 is spaced apart from the active pixel area 1110 and the first dummy pixel area 1120 with the second dummy pixel area 1130 therebetween, the color separating lens array 130 may not be formed in the optical black area 1140.

Figure 11:
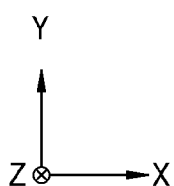
FIG. 11 is a diagram for illustrating a distance at which light incident on one pixel is dispersed due to the color separating lens array.

FIG. 11 is a diagram for illustrating a distance in which light incident on one pixel is dispersed due to the color separating lens array 130.

FIG. 11 shows a degree of sensing green light having 530 nm wavelength on the sensor substrate 110, wherein the green light of 530 nm wavelength is incident on the third region 133 of the color separating lens array 130 formed in the second dummy pixel area 1130. In detail, the incident position of the green light is a reference third region 133 that is above a reference third pixel 113 in Z direction, which is underlined from among the third pixels 113 of FIG. 11, and when an intensity of the green light incident on the reference third region 133 is 1, intensities of light incident on the pixels are indicated in numerical values. For example, the green light having an intensity of 1 is branched while passing through the reference third region 133 of the color separating lens array 130, and then, is sensed by the first pixels 111 adjacent to the reference third pixel 113 by 0.060, and is sensed by the fourth pixels 114 adjacent to the reference third pixel 113 by 0.059 and 0.056.

Referring to FIG. 11, the light intensity sensed by the pixels spaced apart from the reference third pixel 113 by three spaces or greater is 0.002 or less, which is ignorable. For example, the light intensity sensed by the fourth pixel 114 that is at a position three spaces apart from the reference third pixel 113 in the X direction and sensed by the first pixel 111 that is at a position three spaces apart from the reference third pixel 113 in the Y direction are 0.002. That is, the light incident on the color separating lens array 130 may affect the pixels within two pitches from the pixel that is vertically under the region to which the light is incident.

Referring back to FIG. 10A, the light incident on the second region 132 included in the second dummy pixel area 1130 may affect the second pixel 112 included in the first dummy pixel area 1120, and thus, the second dummy pixel area 1130 of FIG. 10B may include two or more pixels in a direction away from the first dummy pixel area 1120, for example, in X direction of FIG. 10B, and may include columns or rows of two to ten pixels, or columns or rows of two to four pixels.

Figure 12A:
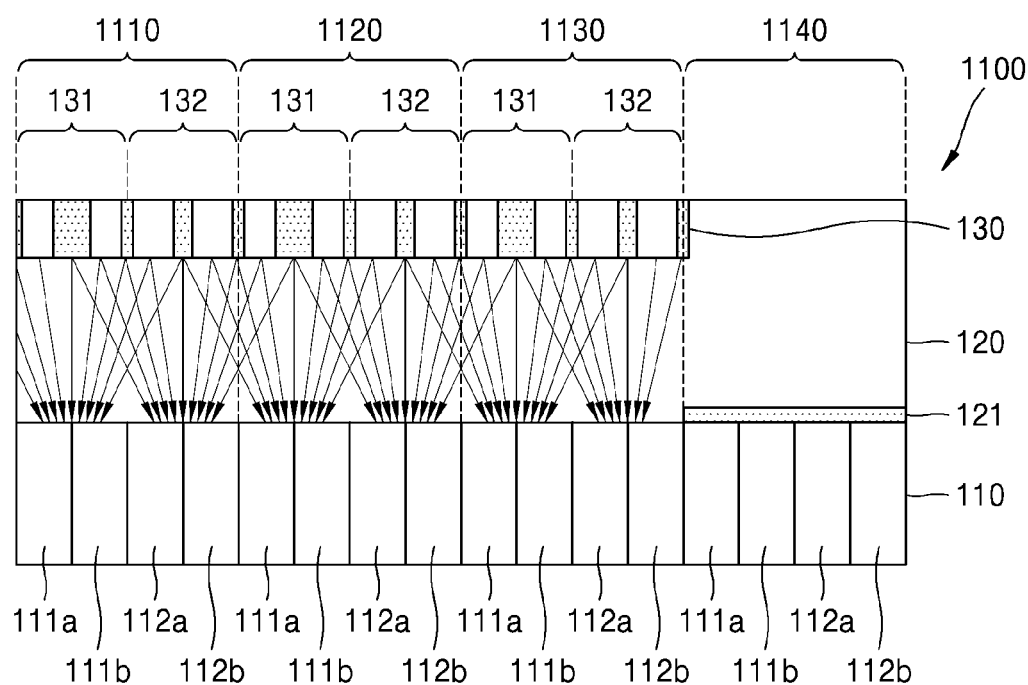
FIG. 12A is a cross-sectional view of a region B according to an example embodiment in which one pixel in the pixel array of FIGS. 2A and 2B includes four sub-pixels.
Figure 12A:
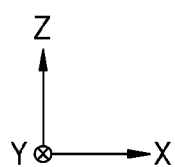
Figure 12B:
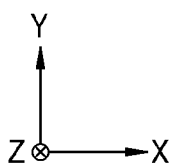
FIG. 12B is a plan view of the sensor substrate shown in FIG. 12A.

FIG. 12A is a cross-sectional view of a region B according to an example embodiment in which one pixel in the pixel array of FIGS. 2A and 2B includes four sub-pixels, and FIG. 12B is a plan view of the sensor substrate shown in FIG. 12A.

Referring to FIG. 12B, each pixel in the sensor substrate 110a of FIG. 12B may include four sub-pixels. For example, the first pixel 111 may include a 1-a to 1-d sub-pixels 111a, 111b, 111c, and 111d, the second pixel 112 may include a 2-a to 2-d sub-pixels 112a, 112b, 112c, and 112d, the third pixel 113 may include a 3-a to 3-d sub-pixels 113a, 113b, 113c, and 113d, and the fourth pixel 114 may include a 4-a to 4-d sub-pixels 114a, 114b, 114c, and 114d, that is, each pixel has a tetra-cell structure. The four sub-pixels included in one pixel may individually output pixel signals, or may output one pixel signal by combining signals sensed by the four sub-pixels.

The color separating lens array 130 of FIG. 12A has similar structure and operations to those of the color separating lens array 130 in FIG. 3A, and thus, descriptions thereof are omitted. The light incident on the second region 132 of the color separating lens array 130 included in the second dummy pixel area 1130 of FIG. 12A may affect the 2-a and 2-b sub-pixels 112a and 112b included in the first dummy pixel area 1120, and thus, the second dummy pixel area 1130 of FIG. 12A may include four or more sub-pixels in a direction away from the first dummy pixel area 1120, for example, X direction of FIG. 12B, and may include four to twenty sub-pixels.

Figure 13A:
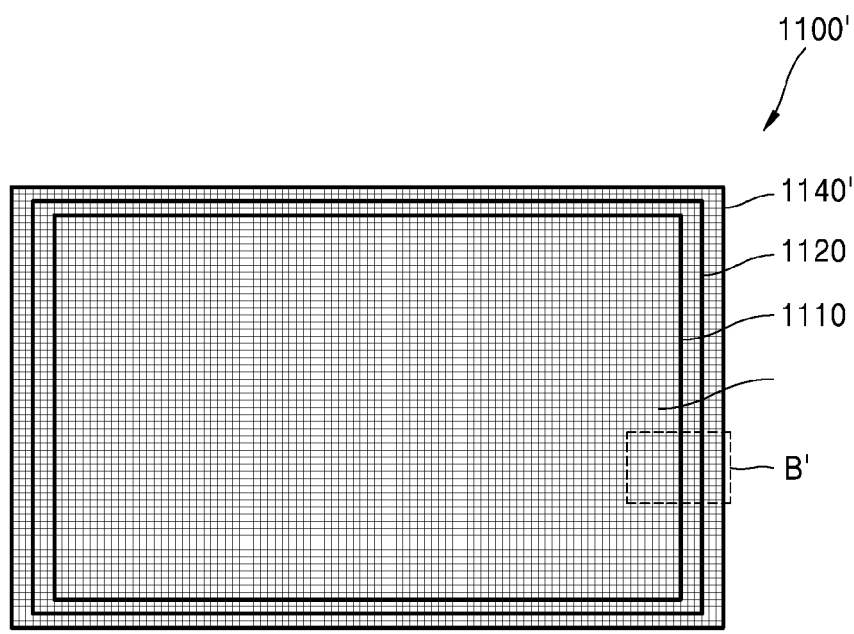
FIG. 13A is a diagram showing a structure of a pixel array according to another example embodiment.
Figure 13B:
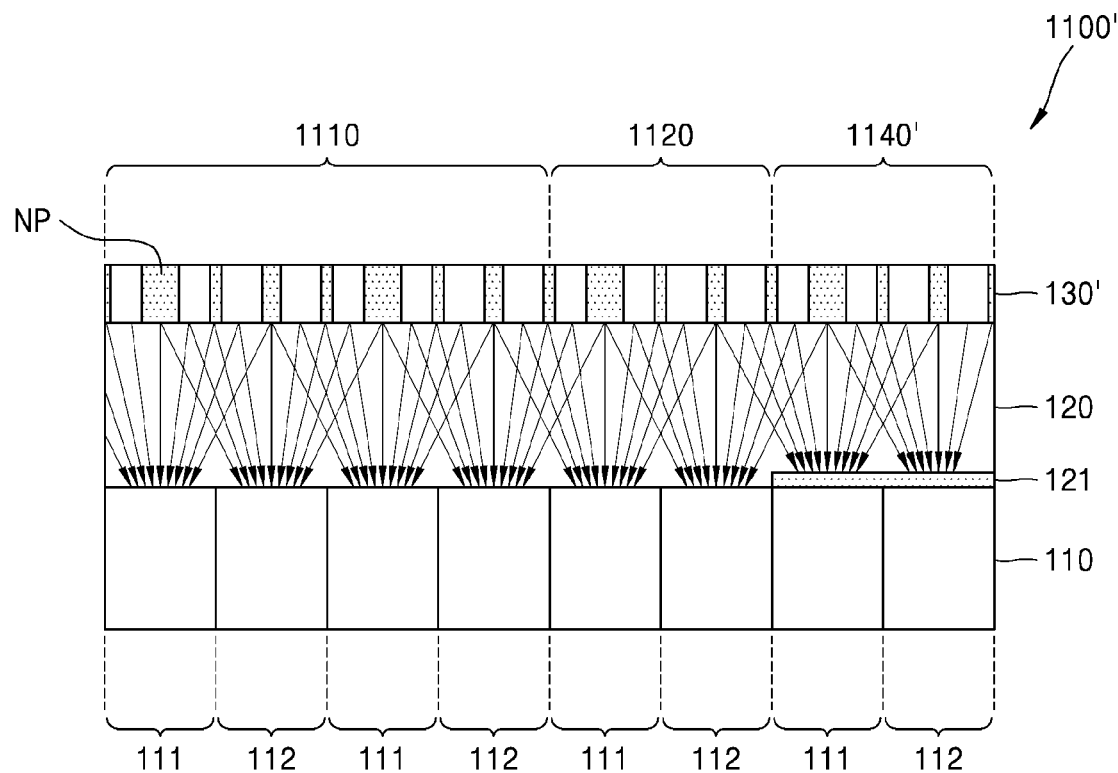
FIG. 13B is a cross-sectional view of a region B' in FIG. 13A.

FIG. 13A is a diagram showing a structure of a pixel array according to another example embodiment, and FIG. 13B is a cross-sectional view of a region B' in FIG. 13A.

The pixel array 1100' of FIG. 13A is different from the pixel array 1100 of FIGS. 2A and 2B, in that the pixel array 1100' does not include the second dummy pixel area 1130 and the color separating lens array 130' is formed in an optical black area 1140'.

Referring to FIG. 13B, the pixel array 1100' may include the color separating lens array 130' formed in the optical black area 1140', such that the pixels 111 and 112 in the first dummy pixel area 1120 may receive light under the same condition as that of the active pixel area 1110. Portion of the incident light traveling toward the optical black area 1140' is branched by the color separating lens array 130' formed in the optical black area 1140', and then may travel to the pixels in the first dummy pixel area 1120. The optical black area 1140' of FIG. 13B may include two or more pixels in a direction away from the first dummy pixel area 1120, for example, X direction of FIG. 13B, for example, the optical black area 1140' may include columns or rows of two to ten pixels, or columns or rows of two to four pixels disposed in a direction away from the first dummy pixel area 1120.

According to the image sensor 1000 including the pixel array 1100 described above, light loss due to a color filter, e.g., an organic color filter, rarely occurs, and thus, a sufficient amount of light may be provided to the pixels even when the pixels become smaller. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic apparatuses. The electronic apparatuses may include, for example, smartphones, personal digital assistants (PDAs), laptop computers, personal computers (PCs), a variety of portable devices, electronic apparatuses, surveillance cameras, medical camera, automobiles, Internet of Things (IoT) devices, other mobile or non-mobile computing devices and are not limited thereto.

The electronic apparatuses may further include, in addition to the image sensor 1000, a processor for controlling the image sensor, for example, an application processor (AP), and may control a plurality of hardware or software elements and may perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor.

Figure 14:
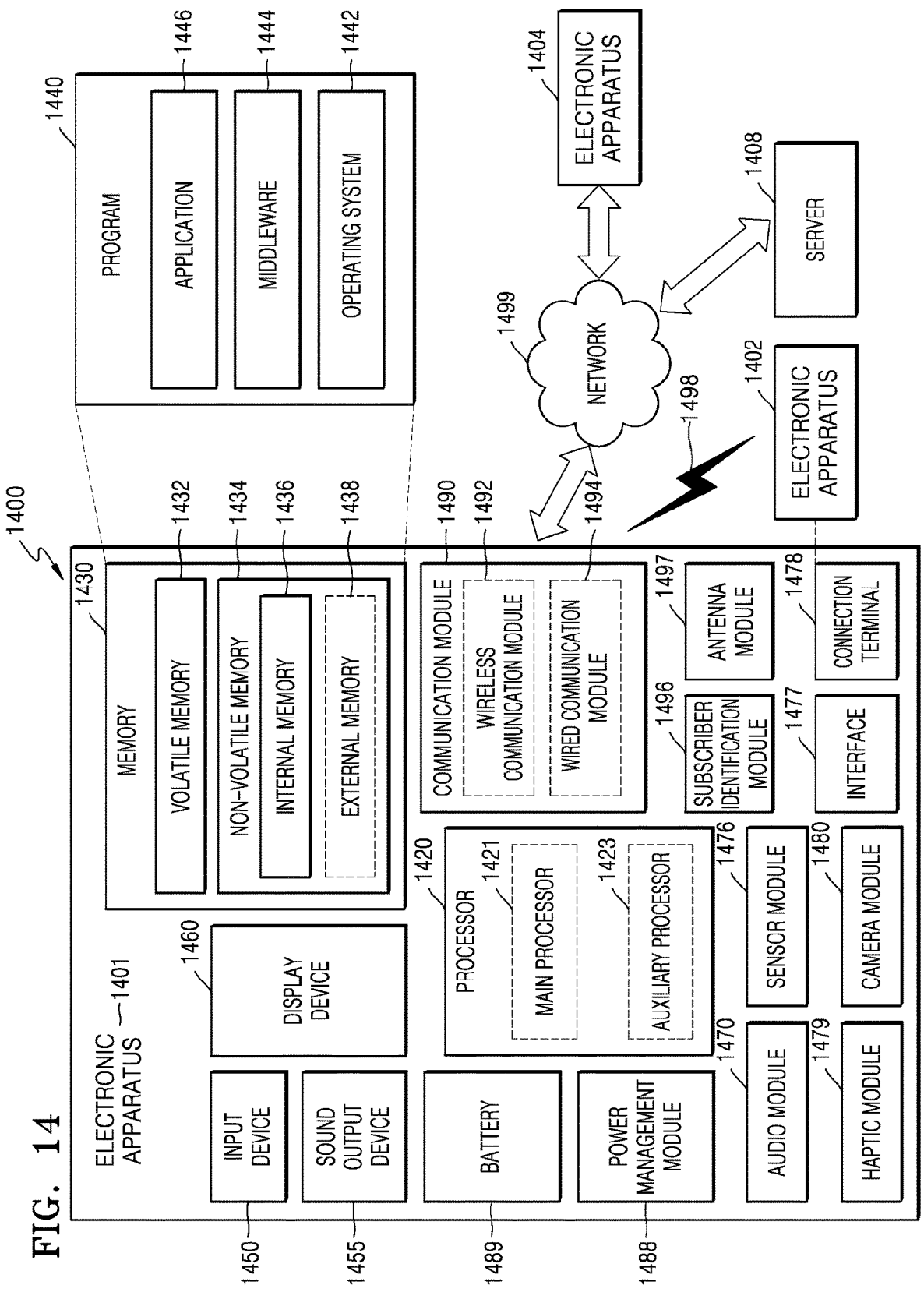
FIG. 14 is a block diagram of an electronic apparatus including an image sensor according to one or more example embodiments.

FIG. 14 is a block diagram showing an example of an electronic apparatus 1401 including the image sensor 1000. Referring to FIG. 14, in a network environment 1400, the electronic apparatus 1401 may communicate with another electronic apparatus 1402 via a first network 1498 (short-range wireless communication network, etc.), or may communicate with another electronic apparatus 1404 and/or a server 1408 via a second network 1499 (long-range wireless communication network, etc.) The electronic apparatus 1401 may communicate with the electronic apparatus 1404 via the server 1408. The electronic apparatus 1401 may include a processor 1420, a memory 1430, an input device 1450, a sound output device 1455, a display device 1460, an audio module 1470, a sensor module 1476, an interface 1477, a haptic module 1479, a camera module 1480, a power management module 1488, a battery 1489, a communication module 1490, a subscriber identification module 1496, and/or an antenna module 1497. In the electronic apparatus 1401, some (display device 1460, etc.) of the elements may be omitted or another element may be added. Some of the elements may be configured as one integrated circuit. For example, the sensor module 1476 (a fingerprint sensor, an iris sensor, an illuminance sensor, etc.) may be embedded and implemented in the display device 1460 (display, etc.)

The processor 1420 may control one or more elements (hardware, software elements, etc.) of the electronic apparatus 1401 connected to the processor 1420 by executing software (program 1440, etc.), and may perform various data processes or operations. As a part of the data processing or operations, the processor 1420 may load a command and/or data received from another element (sensor module 1476, communication module 1490, etc.) to a volatile memory 1432, may process the command and/or data stored in the volatile memory 1432, and may store result data in a non-volatile memory 1434. The processor 1420 may include a main processor 1421 (central processing unit, application processor, etc.) and an auxiliary processor 1423 (graphic processing unit, image signal processor, sensor hub processor, communication processor, etc.) that may be operated independently from or along with the main processor 1421. The auxiliary processor 1423 may use less power than that of the main processor 1421, and may perform specific functions.

The auxiliary processor 1423, on behalf of the main processor 1421 while the main processor 1421 is in an inactive state (sleep state) or along with the main processor 1421 while the main processor 1421 is in an active state (application executed state), may control functions and/or states related to some (display device 1460, sensor module 1476, communication module 1490, etc.) of the elements in the electronic apparatus 1401. The auxiliary processor 1423 (image signal processor, communication processor, etc.) may be implemented as a part of another element (camera module 1480, communication module 1490, etc.) that is functionally related thereto.

The memory 1430 may store various data required by the elements (processor 1420, sensor module 1476, etc.) of the electronic apparatus 1401. The data may include, for example, input data and/or output data about software (program 1440, etc.) and commands related thereto. The memory 1430 may include the volatile memory 1432 and/or the non-volatile memory 1434. The non-volatile memory 1434 may include an internal memory 1436 fixedly installed in the electronic apparatus 1401, and an external memory 1438 that is detachable.

The program 1440 may be stored as software in the memory 1430, and may include an operation system 1442, middleware 1444, and/or an application 1446.

The input device 1450 may receive commands and/or data to be used in the elements (processor 1420, etc.) of the electronic apparatus 1401, from outside (user, etc.) of the electronic apparatus 1401. The input device 1450 may include a microphone, a mouse, a keyboard, and/or a digital pen (stylus pen).

The sound output device 1455 may output a sound signal to outside of the electronic apparatus 1401. The sound output device 1455 may include a speaker and/or a receiver. The speaker may be used for a general purpose such as multimedia reproduction or record play, and the receiver may be used to receive a call. The receiver may be coupled as a part of the speaker or may be implemented as an independent device.

The display device 1460 may provide visual information to outside of the electronic apparatus 1401. The display device 1460 may include a display, a hologram device, or a projector, and a control circuit for controlling the corresponding device. The display device 1460 may include a touch circuitry set to sense a touch, and/or a sensor circuit (pressure sensor, etc.) that is set to measure a strength of a force generated by the touch.

The audio module 1470 may convert sound into an electrical signal or vice versa. The audio module 1470 may acquire sound through the input device 1450, or may output sound via the sound output device 1455 and/or a speaker and/or a headphone of another electronic apparatus (electronic apparatus 1402, etc.) connected directly or wirelessly to the electronic apparatus 1401.

The sensor module 1476 may sense an operating state (power, temperature, etc.) of the electronic apparatus 1401, or an outer environmental state (user state, etc.), and may generate an electrical signal and/or data value corresponding to the sensed state. The sensor module 1476 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface 1477 may support one or more designated protocols that may be used in order for the electronic apparatus 1401 to be directly or wirelessly connected to another electronic apparatus (electronic apparatus 1402, etc.) The interface 1477 may include a high-definition multimedia interface (HDMI), a universal serial bus (USB) interface, an SD card interface, and/or an audio interface.

The connection terminal 1478 may include a connector by which the electronic apparatus 1401 may be physically connected to another electronic apparatus (electronic apparatus 1402, etc.). The connection terminal 1478 may include an HDMI connector, a USB connector, an SD card connector, and/or an audio connector (headphone connector, etc.).

The haptic module 1479 may convert the electrical signal into a mechanical stimulation (vibration, motion, etc.) or an electric stimulation that the user may sense through a tactile or motion sensation. The haptic module 1479 may include a motor, a piezoelectric device, and/or an electric stimulus device.

The camera module 1480 may capture a still image and a video. The camera module 1480 may include a lens assembly including one or more lenses, the image sensor 1000 of FIG. 1, image signal processors, and/or flashes. The lens assembly included in the camera module 1480 may collect light emitted from an object that is to be captured.

The power management module 1488 may manage the power supplied to the electronic apparatus 1401. The power management module 1488 may be implemented as a part of a power management integrated circuit (PMIC).

The battery 1489 may supply electric power to components of the electronic apparatus 1401. The battery 1489 may include a primary battery that is not rechargeable, a secondary battery that is rechargeable, and/or a fuel cell.

The communication module 1490 may support the establishment of a direct (wired) communication channel and/or a wireless communication channel between the electronic apparatus 1401 and another electronic apparatus (electronic apparatus 1402, electronic apparatus 1404, server 1408, etc.), and execution of communication through the established communication channel. The communication module 1490 may be operated independently from the processor 1420 (application processor, etc.), and may include one or more communication processors that support the direct communication and/or the wireless communication. The communication module 1490 may include a wireless communication module 1492 (cellular communication module, a short-range wireless communication module, a global navigation satellite system (GNSS) communication module) and/or a wired communication module 1494 (local area network (LAN) communication module, a power line communication module, etc.). From among the communication modules, a corresponding communication module may communicate with another electronic apparatus via a first network 1498 (short-range communication network such as Bluetooth, WiFi direct, or infrared data association (IrDA)) or a second network 1499 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module 1492 may identify and authenticate the electronic apparatus 1401 in a communication network such as the first network 1498 and/or the second network 1499 by using subscriber information (international mobile subscriber identifier (IMSI), etc.) stored in the subscriber identification module 1496.

The antenna module 1497 may transmit or receive the signal and/or power to/from outside (another electronic apparatus, etc.). An antenna may include a radiator formed as a conductive pattern formed on a substrate (PCB, etc.). The antenna module 1497 may include one or more antennas. When the antenna module 1497 includes a plurality of antennas, from among the plurality of antennas, an antenna that is suitable for the communication type used in the communication network such as the first network 1498 and/or the second network 1499 may be selected by the communication module 1490. The signal and/or the power may be transmitted between the communication module 1490 and another electronic apparatus via the selected antenna. Another component (RFIC, etc.) other than the antenna may be included as a part of the antenna module 1497.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus 1401 and the external electronic apparatus 1404 via the server 1408 connected to the second network 1499. Other electronic apparatuses 1402 and 1404 may be the devices that are the same as or different kinds from the electronic apparatus 1401. All or some of the operations executed in the electronic apparatus 1401 may be executed in one or more devices among the other electronic apparatuses 1402, 1404, and 1408. For example, when the electronic apparatus 1401 has to perform a certain function or service, the electronic apparatus 1401 may request one or more other electronic apparatuses to perform some or entire function or service, instead of executing the function or service by itself. One or more electronic apparatuses receiving the request execute an additional function or service related to the request and may transfer a result of the execution to the electronic apparatus 1401. To do this, for example, a cloud computing, a distributed computing, or a client-server computing technique may be used.

Figure 15:
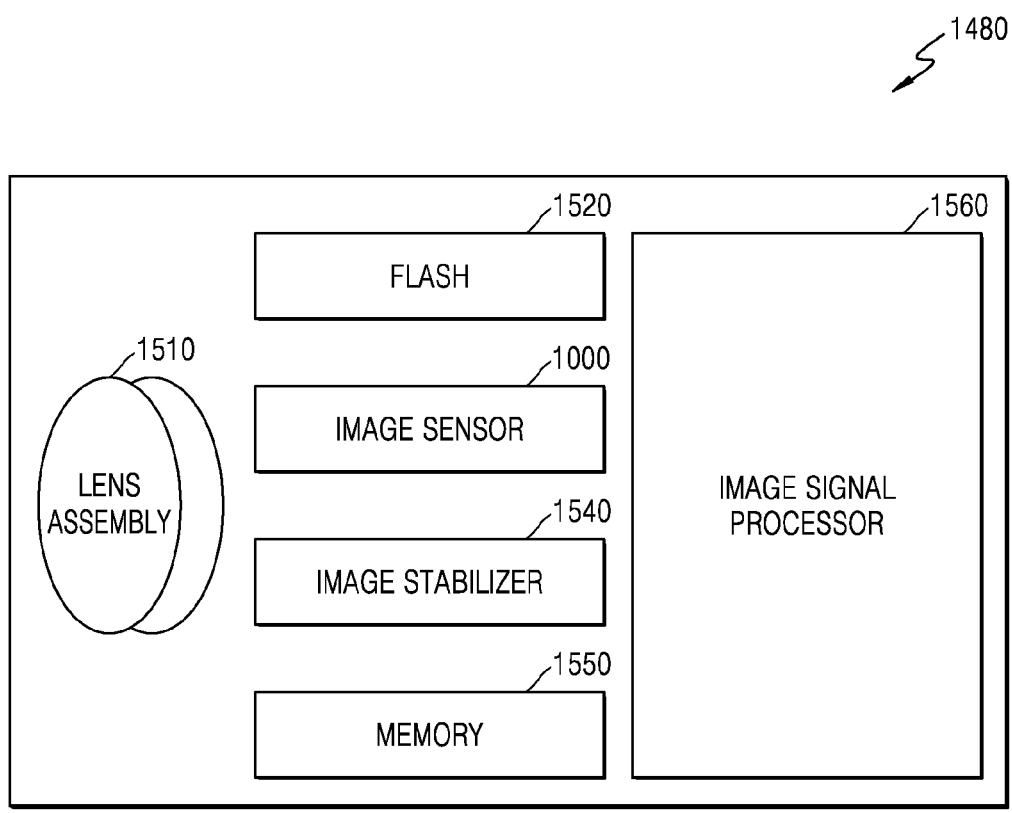
FIG. 15 is a block diagram of a camera module of FIG. 14.

FIG. 15 is a block diagram showing the camera module 1480 of FIG. 14. Referring to FIG. 15, the camera module 1480 may include a lens assembly 1510, a flash 1520, an image sensor 1000 (the image sensor 1000 of FIG. 1), an image stabilizer 1540, a memory 1550 (buffer memory, etc.), and/or an image signal processor 1560. The lens assembly 1510 may collect light emitted from an object that is to be captured. The camera module 1480 may include a plurality of lens assemblies 1510, and in this case, the camera module 1480 may include a dual camera module, a 360-degree camera, or a spherical camera. Some of the plurality of lens assemblies 1510 may have the same lens properties (viewing angle, focal distance, auto-focus, F number, optical zoom, etc.) or different lens properties. The lens assembly 1510 may include a wide-angle lens or a telephoto lens.

The flash 1520 may emit light that is used to strengthen the light emitted or reflected from the object. The flash 1520 may include one or more light-emitting diodes (red-green-blue (RGB) LED, white LED, infrared LED, ultraviolet LED, etc.), and/or a Xenon lamp. The image sensor 1000 may be the image sensor described above with reference to FIG. 1, and converts the light emitted or reflected from the object and transferred through the lens assembly 1510 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge-coupled device (CCD) sensor and/or a complementary metal oxide semiconductor (CMOS) sensor.

The image stabilizer 1540, in response to a motion of the camera module 1480 or the electronic apparatus 1501 including the camera module 1480, moves one or more lenses included in the lens assembly 1510 or the image sensor 1000 in a certain direction or controls the operating characteristics of the image sensor 1000 (adjusting of a read-out timing, etc.) in order to compensate for a negative influence of the motion. The image stabilizer 1540 may sense the movement of the camera module 1480 or the electronic apparatus 1401 by using a gyro sensor or an acceleration sensor disposed in or out of the camera module 1480. The image stabilizer 1540 may be implemented as an optical type.

The memory 1550 may store some or entire data of the image obtained through the image sensor 1000 for next image processing operation. For example, when a plurality of images are obtained at a high speed, obtained original data (Bayer-patterned data, high resolution data, etc.) is stored in the memory 1550, and a low resolution image is only displayed. Then, original data of a selected image (user selection, etc.) may be transferred to the image signal processor 1560. The memory 1550 may be integrated with the memory 1430 of the electronic apparatus 1401, or may include an additional memory that is operated independently.

The image signal processor 1560 may perform image treatment on the image obtained through the image sensor 1000 or the image data stored in the memory 1550. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor 1560 may perform controlling (exposure time control, read-out timing control, etc.) of the elements (image sensor 1000, etc.) included in the camera module 1580. The image processed by the image signal processor 1560 may be stored again in the memory 1550 for additional process, or may be provided to an external element of the camera module 1480 (e.g., the memory 1430, the display device 1460, the electronic apparatus 1402, the electronic apparatus 1404, the server 1408, etc.). The image signal processor 1560 may be integrated with the processor 1420, or may be configured as an additional processor that is independently operated from the processor 1420. When the image signal processor 1560 is configured as an additional processor separately from the processor 1420, the image processed by the image signal processor 1560 undergoes an additional image treatment by the processor 1420 and then may be displayed on the display device 1460.

The electronic apparatus 1401 may include a plurality of camera modules 1480 having different properties or functions. In this case, one of the plurality of camera modules 1480 may include a wide-angle camera and another camera module ED80 may include a telephoto camera. Similarly, one of the plurality of camera modules 1480 may include a front camera and another camera module 1480 may include a rear camera.

Figure 16:
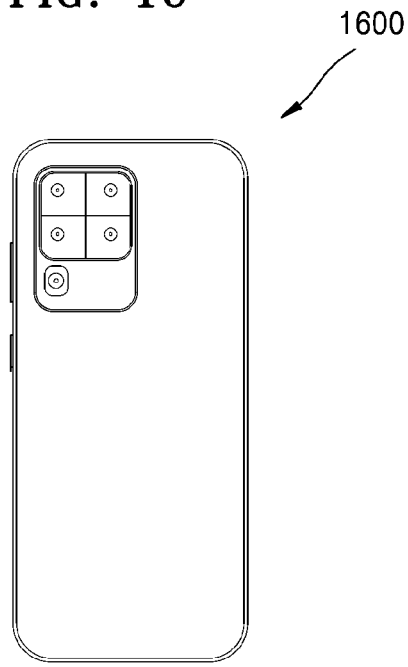
FIGS. 16 to 25 are diagrams showing various examples of an electronic device including an image sensor according to one or more example embodiments.
Figure 17:
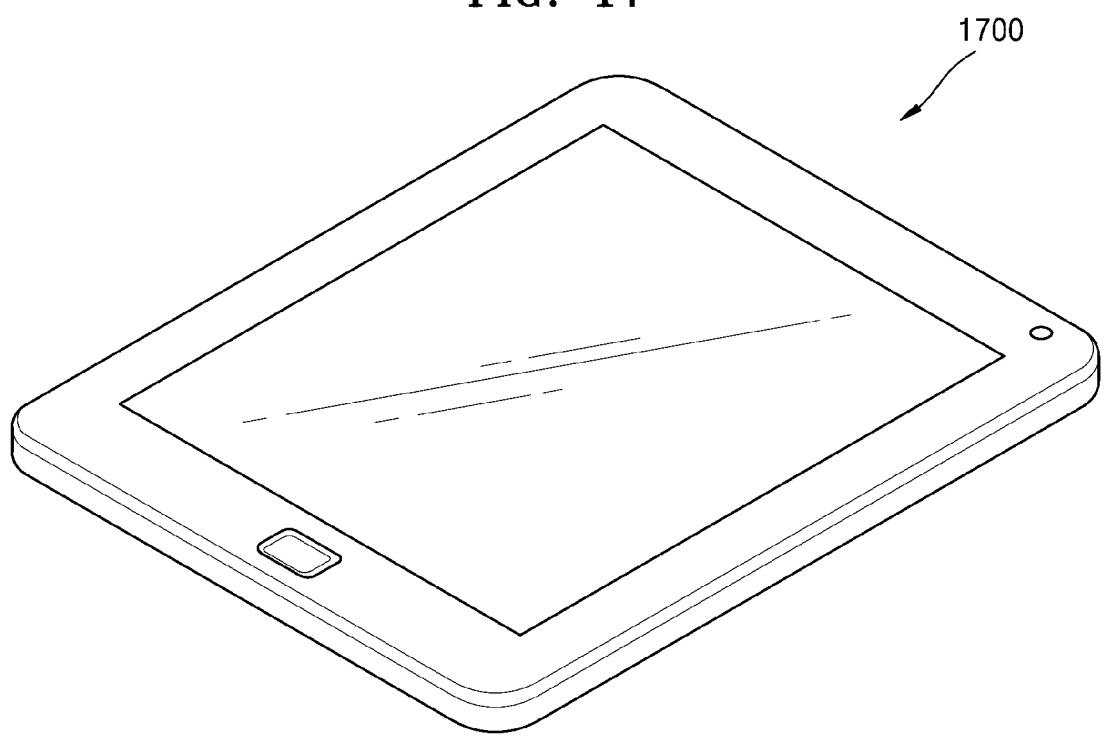
Figure 18:
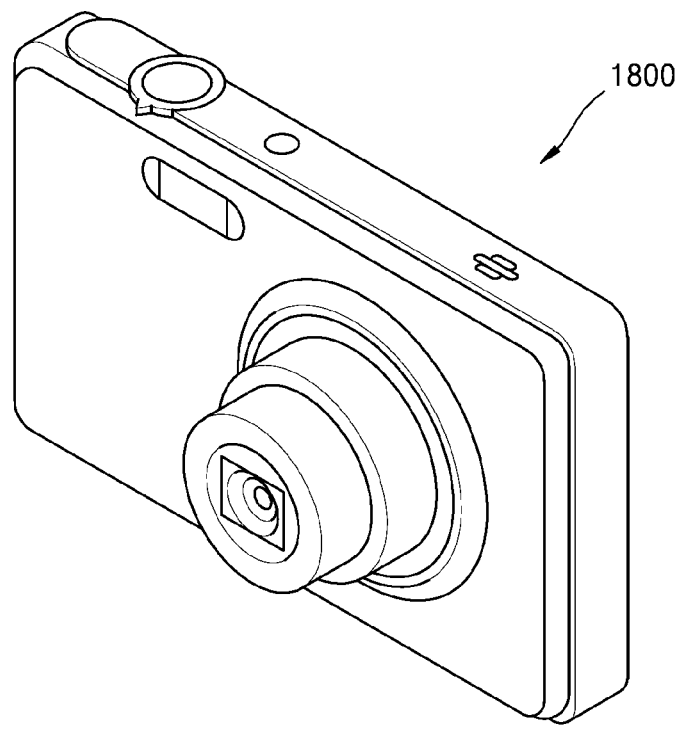
Figure 19:
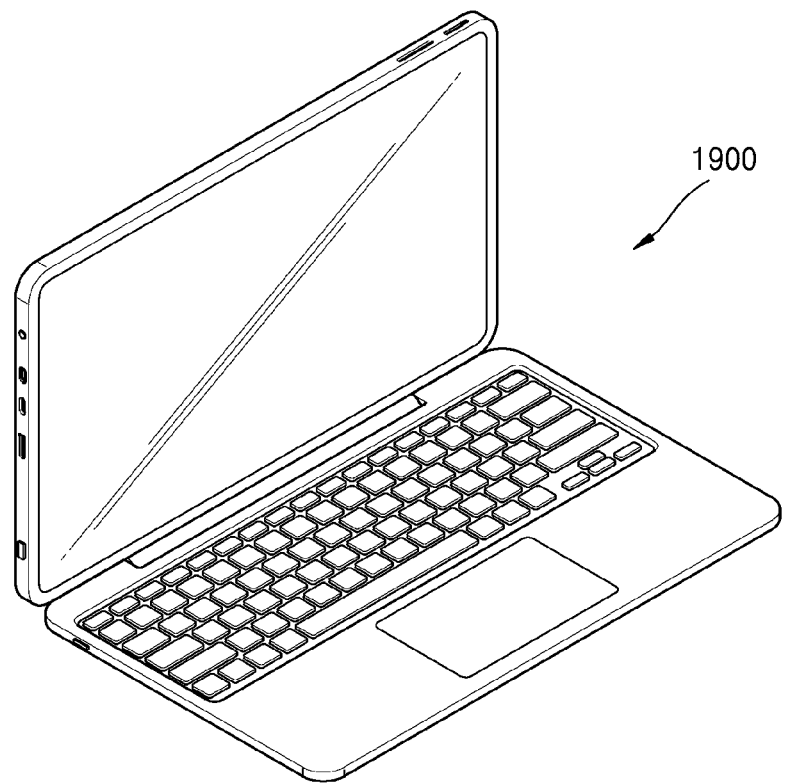
Figure 20:
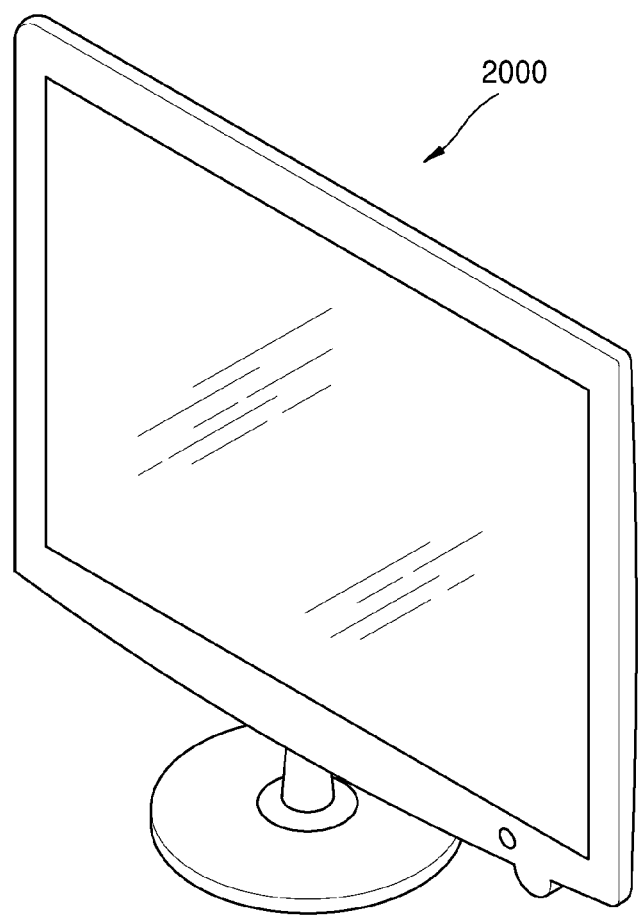

The image sensor 1000 according to the example embodiments may be applied to a mobile phone or a smartphone 1600 shown in FIG. 16, a tablet or a smart tablet 1700 shown in FIG. 17, a digital camera or a camcorder 1800 shown in FIG. 18, a laptop computer 1900 shown in FIG. 19, or a television or a smart television 2000 shown in FIG. 20. For example, the smartphone 1600 or the smart tablet 1700 may include a plurality of high-resolution cameras each including a high-resolution image sensor. Depth information of objects in an image may be extracted, out focusing of the image may be adjusted, or objects in the image may be automatically identified by using the high-resolution cameras.

Figure 21:
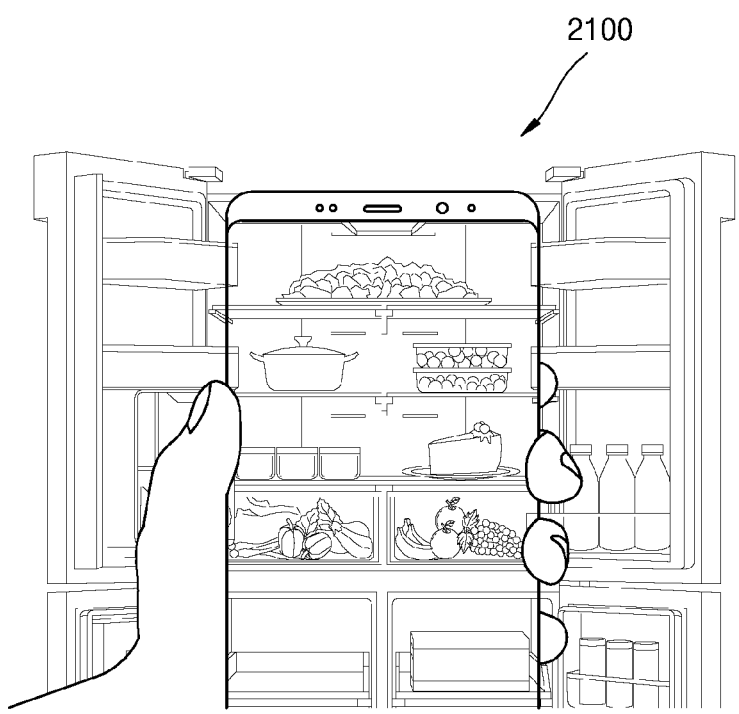
Figure 22:
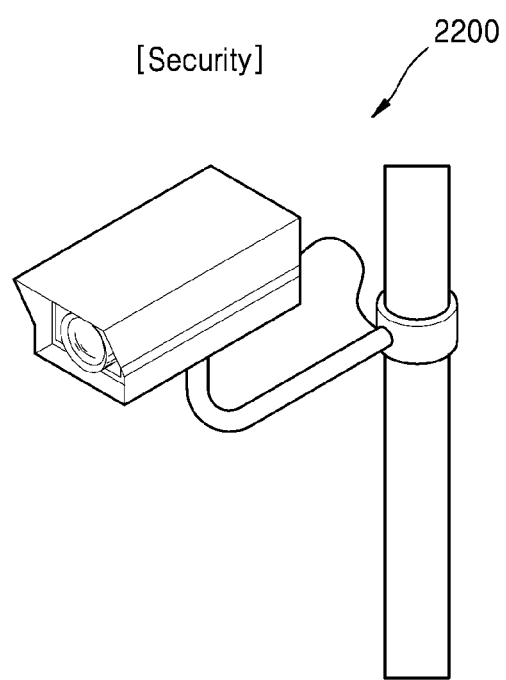
Figure 23:
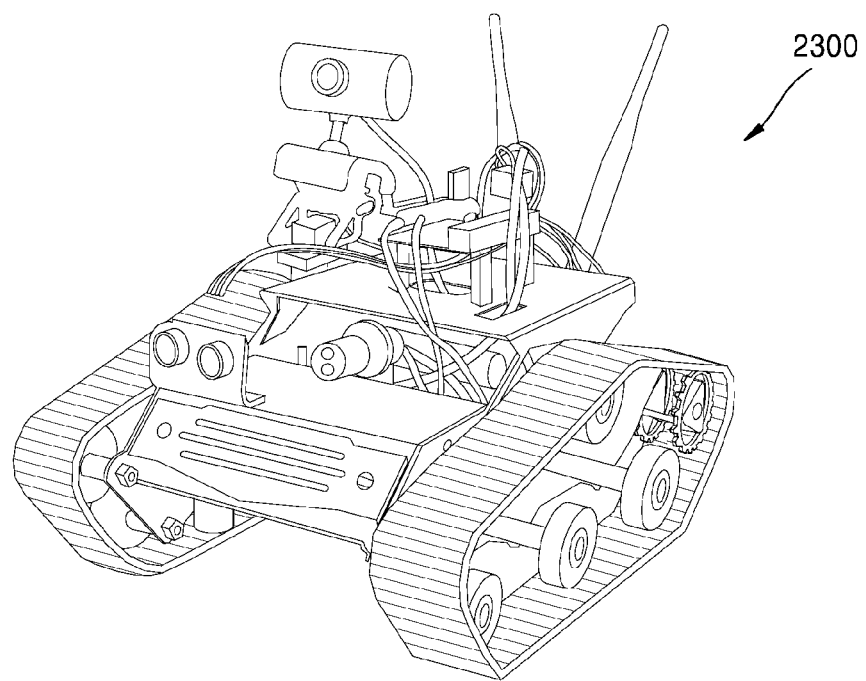
Figure 24:
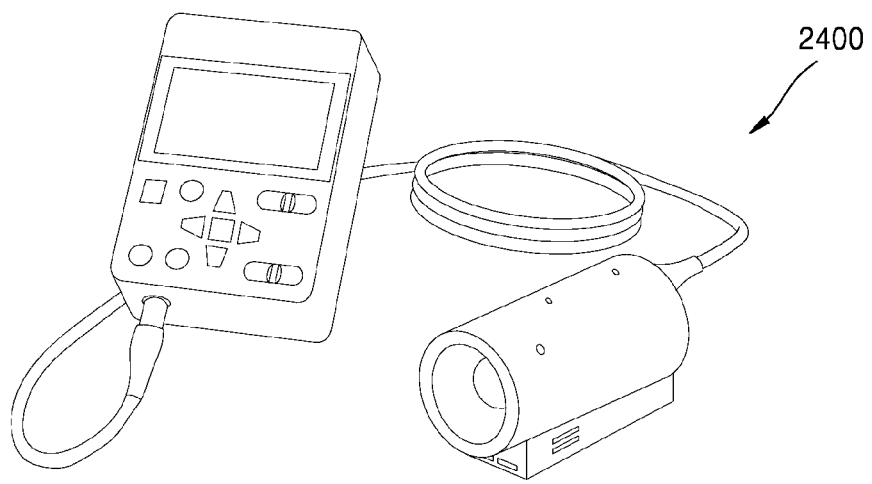

Also, the image sensor 1000 may be applied to a smart refrigerator 2100 shown in FIG. 21, a surveillance camera 2200 shown in FIG. 22, a robot 2300 shown in FIG. 23, a medical camera 2400 shown in FIG. 24, etc. For example, the smart refrigerator 2100 may automatically recognize food in the refrigerator by using the image sensor, and may notify the user of an existence of a certain kind of food, kinds of food put into or taken out, etc. through a smartphone. Also, the surveillance camera 2200 may provide an ultra-high-resolution image and may allow the user to recognize an object or a person in the image even in dark environment by using high sensitivity. The robot 2300 may be input to a disaster or industrial site that a person may not directly access, to provide the user with high-resolution images. The medical camera 2400 may provide high-resolution images for diagnosis or surgery, and may dynamically adjust a field of view.

Figure 25:
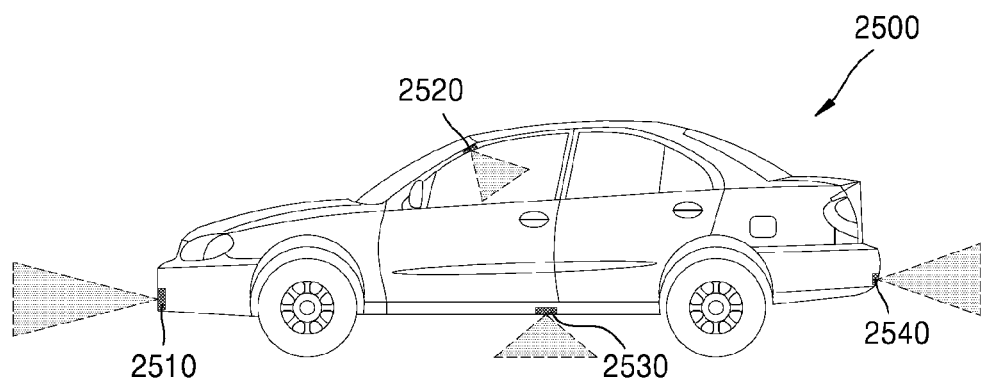

Also, the image sensor 1000 may be applied to a vehicle 2500 as shown in FIG. 25. The vehicle 2500 may include a plurality of vehicle cameras 2510, 2520, 2530, and 2540 at various locations. Each of the vehicle cameras 2510, 2520, 2530, and 2540 may include the image sensor according to the one or more example embodiments. The vehicle 2500 may provide a driver with various information about the interior of the vehicle 2500 or the periphery of the vehicle 2500 by using the plurality of vehicle cameras 2510, 2520, 2530, and 2540, and may provide the driver with the information necessary for the autonomous travel by automatically recognizing an object or a person in the image.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:
   a sensor substrate comprising:
      an active pixel area configured to output an active pixel signal for image generation;
      a first dummy pixel area disposed outside the active pixel area and configured to output a dummy pixel signal to correct image data generated from the active pixel signal; and
      a second dummy pixel area disposed outside the active pixel area and the first dummy pixel area and configured to not output any pixel signal; and
   a color separating lens array facing the sensor substrate, wherein the color separating lens array is configured to condense at least portion of a first light of a first wavelength incident on a region of the color separating lens array facing the second dummy pixel area of the sensor substrate, onto a first pixel in the first dummy pixel area of the sensor substrate, by changing a phase of the first light of the first wavelength.

2. The image sensor of claim 1, wherein the second dummy pixel area comprises pixels arranged in two or more columns or two or more rows outside the active pixel area.

3. The image sensor of claim 1, wherein the color separating lens array comprises nanoposts above the active pixel area, the first dummy pixel area, and the second dummy pixel area.

4. The image sensor of claim 1, wherein the color separating lens array is further configured to change a phase of a second light of a second wavelength to be different from the phase of the first light of the first wavelength and condense the second light of the second wavelength onto a second pixel of the sensor substrate.

5. The image sensor of claim 1, wherein the dummy pixel signal output from the first dummy pixel area is a signal for correcting the active pixel signal output from the active pixel area.

6. The image sensor of claim 1, wherein the first dummy pixel area is disposed on an outer side of the active pixel area to surround the active pixel area.

7. The image sensor of claim 1, wherein the second dummy pixel area is disposed on an outer side of the first dummy pixel area to surround the first dummy pixel area.

8. The image sensor of claim 1, wherein the sensor substrate further comprises an optical black area that is disposed on an outer side of the second dummy pixel area and comprises a light-shielding metal layer, the optical black area being configured to output a black pixel signal.

9. The image sensor of claim 8, wherein the color separating lens array comprises nanoposts disposed above the optical black area.

10. The image sensor of claim 8,
    wherein the optical black area is disposed on the outer side of the second dummy pixel area to surround the second dummy pixel area.

11. The image sensor of claim 8, wherein the optical black area of the sensor substrate is further configured to output pixel signals based on noise of a photodiode.

12. The image sensor of claim 1, wherein the color separating lens array comprises a plurality of microlenses configured to condense the first light of the first wavelength on the first pixel, and an area of each of the plurality of microlenses is greater than an area of the first pixel.

13. The image sensor of claim 12, wherein the area of each of the plurality of microlenses is 1.5 to 4 times greater than the area of the first pixel.

14. An image sensor comprising:
a sensor substrate comprising:
an active pixel area configured to output an active pixel signal for image generation;
a dummy pixel area disposed outside the active pixel area and configured to output a dummy pixel signal to correct image data generated from the active pixel signal; and
an optical black area disposed outside the active pixel area and the dummy pixel area and configured to output a black pixel signal; and
a color separating lens array facing the sensor substrate, wherein the color separating lens array is configured to condense at least portion of a first light of a first wavelength incident on a region of the color separating lens array facing the optical black area, onto a first pixel in the dummy pixel area, by changing a phase of the first light of the first wavelength.

15. The image sensor of claim 14, wherein the optical black area includes pixels arranged in two or more columns or two or more rows outside the active pixel area.

16. The image sensor of claim 14, wherein the color separating lens array comprises nanoposts above the active pixel area, the dummy pixel area, and the optical black area.

17. The image sensor of claim 14, wherein the color separating lens array is further configured to change a phase of a second light of a second wavelength to be different from a phase of the first light of the first wavelength and condense the second light of the second wavelength onto a second pixel of the sensor substrate.

18. The image sensor of claim 14, wherein the sensor substrate comprises a light-shielding metal layer formed on pixels included in the optical black area of the sensor substrate.

19. The image sensor of claim 14, wherein the dummy pixel signal output from the dummy pixel area is a signal for correcting the active pixel signal output from the active pixel area.

20. The image sensor of claim 14, wherein the dummy pixel area is disposed on an outer side of the active pixel area to surround the active pixel area.

21. The image sensor of claim 14, wherein the optical black area is disposed on an outer side of the dummy pixel area to surround the dummy pixel area.

22. The image sensor of claim 14, wherein each of pixels included in the optical black area is configured to output the black pixel signal based on noise of a photodiode.

23. The image sensor of claim 14, wherein the color separating lens array comprises a plurality of microlenses configured to condense the first light of the first wavelength on the first pixel, and an area of the plurality of microlenses is greater than an area of the first pixel.

24. The image sensor of claim 23, wherein the area of the plurality of microlenses is 1.5 to 4 times greater than the area of the first pixel.

25. An electronic apparatus comprising:
the image sensor of claim 1; and
a processor configured to control operations of the image sensor and to store and output a signal generated by the image sensor.

26. The electronic apparatus of claim 25, wherein the processor is further configured to obtain an image based on the active pixel signal and the dummy pixel signal.

27. The electronic apparatus of claim 26, wherein the processor is further configured to:
determine whether an active pixel in the active pixel area is abnormal based on comparison between a pixel value of the active pixel and pixel values of adjacent pixels that are immediately adjacent to the active pixel, wherein the adjacent pixels comprise at least one dummy pixel included in the first dummy pixel area;
adjust the pixel value of the active pixel based the pixel values of the adjacent pixels, based on the active pixel being determined to be abnormal, and
obtain the image based on the adjusted pixel value of the active pixel.

28. An electronic apparatus comprising:
the image sensor of claim 14; and
a processor configured to control operations of the image sensor and to store and output a signal generated by the image sensor.

29. The electronic apparatus of claim 28, wherein the processor is further configured to obtain an image based on the active pixel signal and the dummy pixel signal.

30. The electronic apparatus of claim 29, wherein the processor is further configured to:
determine whether an active pixel in the active pixel area is abnormal based on comparison between a pixel value of the active pixel and pixel values of adjacent pixels that are immediately adjacent to the active pixel, wherein the adjacent pixels comprise at least one dummy pixel included in the dummy pixel area;
adjust the pixel value of the active pixel based the pixel values of the adjacent pixels, based on the active pixel being determined to be abnormal, and
obtain the image based on the adjusted pixel value of the active pixel.

* * * * *